US008705001B2

(12) United States Patent
Ebihara

(10) Patent No.: US 8,705,001 B2
(45) Date of Patent: Apr. 22, 2014

(54) EXPOSURE APPARATUS, AND DEVICE MANUFACTURING METHOD

(75) Inventor: Akimitsu Ebihara, Fukaya (JP)

(73) Assignee: Nikon Corporation, Tokyo (JP)

(*) Notice: Subject to any disclaimer, the term of this patent is extended or adjusted under 35 U.S.C. 154(b) by 864 days.

(21) Appl. No.: 12/923,717

(22) Filed: Oct. 5, 2010

(65) Prior Publication Data

US 2011/0025996 A1 Feb. 3, 2011

Related U.S. Application Data

(60) Division of application No. 11/340,680, filed on Jan. 27, 2006, now Pat. No. 8,018,575, which is a division of application No. 11/258,846, filed on Oct. 27, 2005, now Pat. No. 7,321,419, which is a continuation of application No. PCT/JP2004/008595, filed on Jun. 18, 2004.

(30) Foreign Application Priority Data

Jun. 19, 2003 (JP) .................................. 2003-174259

(51) Int. Cl.
*G03B 27/42* (2006.01)
*G03B 27/52* (2006.01)
*G03F 7/20* (2006.01)

(52) U.S. Cl.
CPC .................................. *G03F 7/70341* (2013.01)
USPC .............................................. 355/53; 355/30

(58) Field of Classification Search
CPC ............ G03F 7/70341; G03F 7/70716; G03F 7/70733
USPC ...................... 355/30, 53, 55, 67, 72; 250/548
See application file for complete search history.

(56) References Cited

U.S. PATENT DOCUMENTS

| 3,648,587 | A | 3/1972 | Stevens |
| 4,026,653 | A | 5/1977 | Appelbaum et al. |
| 4,341,164 | A | 7/1982 | Johnson |
| 4,346,164 | A | 8/1982 | Tabarelli et al. |

(Continued)

FOREIGN PATENT DOCUMENTS

| DE | 221 563 A1 | 4/1985 |
| DE | 224 448 A1 | 7/1985 |

(Continued)

OTHER PUBLICATIONS

Jan. 24, 2012 Office Action issue in EP Application No. 10 185 953.6.

(Continued)

*Primary Examiner* — Hung Henry Nguyen
(74) *Attorney, Agent, or Firm* — Oliff PLC

(57) ABSTRACT

An immersion liquid is supplied to a space between a projection system and a substrate, and a patterned beam of radiation is projected through the liquid onto a target portion of the substrate using the projection system. A liquid retaining member is replaced with a table member that holds the substrate at an opposite position to the projection system while the liquid is maintained in contact with the projection system so as to transit from a first state to a second state, the first state in which the liquid is maintained between the projection system and the liquid retaining member, the second state in which the liquid is maintained between the projection system and the table member.

48 Claims, 12 Drawing Sheets

(56) References Cited

U.S. PATENT DOCUMENTS

| | | |
|---|---|---|
| 4,465,368 A | 8/1984 | Matsuura et al. |
| 4,480,910 A | 11/1984 | Takanashi et al. |
| 4,509,852 A | 4/1985 | Tabarelli et al. |
| 4,650,983 A | 3/1987 | Suwa |
| 4,780,617 A | 10/1988 | Umatate et al. |
| RE32,795 E | 12/1988 | Matsuura et al. |
| 5,121,256 A | 6/1992 | Corle et al. |
| 5,243,195 A | 9/1993 | Nishi |
| 5,448,332 A | 9/1995 | Sakakibara et al. |
| 5,528,100 A | 6/1996 | Igeta et al. |
| 5,528,118 A | 6/1996 | Lee |
| 5,534,970 A | 7/1996 | Nakashima et al. |
| 5,591,958 A | 1/1997 | Nishi et al. |
| 5,610,683 A | 3/1997 | Takahashi |
| 5,610,863 A | 3/1997 | Yamada |
| 5,611,452 A | 3/1997 | Bonora et al. |
| 5,623,853 A | 4/1997 | Novak et al. |
| 5,636,066 A | 6/1997 | Takahashi |
| 5,646,413 A | 7/1997 | Nishi |
| 5,650,840 A | 7/1997 | Taniguchi |
| 5,668,672 A | 9/1997 | Oomura |
| 5,677,758 A | 10/1997 | McEachern et al. |
| 5,689,377 A | 11/1997 | Takahashi |
| 5,691,802 A | 11/1997 | Takahashi |
| 5,693,439 A | 12/1997 | Tanaka et al. |
| 5,715,039 A | 2/1998 | Fukuda et al. |
| 5,744,924 A | 4/1998 | Lee |
| 5,805,334 A | 9/1998 | Takahashi |
| 5,815,246 A | 9/1998 | Sperling et al. |
| 5,825,043 A | 10/1998 | Suwa |
| 5,835,275 A | 11/1998 | Takahashi et al. |
| 5,844,247 A | 12/1998 | Nishi |
| 5,861,997 A | 1/1999 | Takahashi |
| 5,874,820 A | 2/1999 | Lee |
| 5,900,354 A | 5/1999 | Batchelder |
| 5,942,871 A | 8/1999 | Lee |
| 5,964,441 A | 10/1999 | Gauger et al. |
| 5,969,441 A | 10/1999 | Loopstra et al. |
| 5,982,128 A | 11/1999 | Lee |
| 5,999,333 A | 12/1999 | Takahashi |
| 6,008,500 A | 12/1999 | Lee |
| 6,020,710 A | 2/2000 | Lee |
| 6,049,186 A | 4/2000 | Lee |
| 6,051,843 A | 4/2000 | Nishi |
| RE36,730 E | 6/2000 | Nishi |
| 6,087,797 A | 7/2000 | Lee |
| 6,137,561 A | 10/2000 | Imai |
| 6,150,787 A | 11/2000 | Lee |
| 6,151,105 A | 11/2000 | Lee |
| 6,175,404 B1 | 1/2001 | Lee |
| 6,188,195 B1 | 2/2001 | Lee |
| 6,208,407 B1 | 3/2001 | Loopstra |
| 6,246,202 B1 | 6/2001 | Lee |
| 6,262,796 B1 | 7/2001 | Loopstra et al. |
| RE37,309 E | 8/2001 | Nakashima et al. |
| 6,271,640 B1 | 8/2001 | Lee |
| 6,279,881 B1 | 8/2001 | Nishi |
| 6,281,654 B1 | 8/2001 | Lee |
| 6,316,901 B2 | 11/2001 | Lee |
| 6,331,885 B1 | 12/2001 | Nishi |
| 6,341,007 B1 | 1/2002 | Nishi et al. |
| 6,400,441 B1 | 6/2002 | Nishi et al. |
| 6,417,914 B1 | 7/2002 | Li |
| 6,426,790 B1 * | 7/2002 | Hayashi ............ 355/72 |
| 6,433,872 B1 | 8/2002 | Nishi et al. |
| 6,445,441 B1 | 9/2002 | Mouri |
| 6,449,030 B1 | 9/2002 | Kwan |
| 6,496,257 B1 | 12/2002 | Taniguchi et al. |
| 6,498,352 B1 | 12/2002 | Nishi |
| 6,549,269 B1 | 4/2003 | Nishi et al. |
| 6,590,634 B1 | 7/2003 | Nishi et al. |
| 6,590,636 B2 | 7/2003 | Nishi |
| 6,608,681 B2 | 8/2003 | Tanaka et al. |
| 6,665,054 B2 | 12/2003 | Inoue |
| 6,680,774 B1 | 1/2004 | Heinle |
| 6,683,433 B2 | 1/2004 | Lee |
| RE38,421 E | 2/2004 | Takahashi |
| RE38,438 E | 2/2004 | Takahashi |
| 6,747,732 B1 | 6/2004 | Lee |
| 6,771,350 B2 | 8/2004 | Nishinaga |
| 6,778,257 B2 | 8/2004 | Bleeker et al. |
| 6,788,385 B2 | 9/2004 | Tanaka et al. |
| 6,788,477 B2 | 9/2004 | Lin |
| 6,798,491 B2 | 9/2004 | Nishi et al. |
| 6,841,965 B2 | 1/2005 | Lee |
| 6,842,221 B1 | 1/2005 | Shiraishi |
| 6,853,443 B2 | 2/2005 | Nishi |
| 6,867,844 B2 | 3/2005 | Vogel et al. |
| 6,878,916 B2 | 4/2005 | Schuster |
| 6,891,596 B2 | 5/2005 | Rostalski et al. |
| 6,891,683 B2 | 5/2005 | Schuster |
| 6,897,963 B1 | 5/2005 | Taniguchi et al. |
| 6,906,782 B2 | 6/2005 | Nishi |
| 6,927,836 B2 | 8/2005 | Nishinaga |
| 6,927,840 B2 | 8/2005 | Lee |
| 6,952,253 B2 | 10/2005 | Lof et al. |
| 6,954,256 B2 | 10/2005 | Flagello et al. |
| 6,989,647 B1 | 1/2006 | Lee |
| RE39,024 E | 3/2006 | Takahashi |
| 7,009,682 B2 | 3/2006 | Bleeker |
| 7,038,760 B2 | 5/2006 | Mulkens et al. |
| 7,057,702 B2 | 6/2006 | Lof et al. |
| 7,075,616 B2 | 7/2006 | Derksen et al. |
| 7,081,943 B2 | 7/2006 | Lof et al. |
| 7,092,069 B2 | 8/2006 | Schuster |
| 7,098,991 B2 | 8/2006 | Nagasaka et al. |
| RE39,296 E | 9/2006 | Takahashi |
| 7,110,081 B2 | 9/2006 | Hoogendam et al. |
| 7,119,874 B2 | 10/2006 | Cox et al. |
| 7,119,876 B2 | 10/2006 | Van Der Toorn et al. |
| 7,119,881 B2 | 10/2006 | Bleeker |
| 7,154,676 B2 | 12/2006 | Schuster |
| 7,161,659 B2 | 1/2007 | Van Den Brink et al. |
| 7,177,008 B2 | 2/2007 | Nishi et al. |
| 7,190,527 B2 | 3/2007 | Rostalski et al. |
| 7,193,232 B2 | 3/2007 | Lof et al. |
| 7,199,858 B2 | 4/2007 | Lof et al. |
| 7,203,008 B2 | 4/2007 | Schuster |
| 7,213,963 B2 | 5/2007 | Lof et al. |
| 7,224,436 B2 | 5/2007 | Derksen et al. |
| 7,256,869 B2 | 8/2007 | Nishi |
| 7,312,847 B2 | 12/2007 | Rostalski et al. |
| 7,321,419 B2 | 1/2008 | Ebihara |
| RE40,043 E | 2/2008 | Kwan et al. |
| 7,327,435 B2 | 2/2008 | Binnard |
| 7,339,743 B2 | 3/2008 | Schuster |
| 7,352,434 B2 | 4/2008 | Streefkerk et al. |
| 7,365,513 B1 | 4/2008 | Lee |
| 7,372,538 B2 * | 5/2008 | Binnard ............ 355/30 |
| 7,372,541 B2 | 5/2008 | Lof et al. |
| 7,379,158 B2 | 5/2008 | Mizutani et al. |
| 7,382,540 B2 | 6/2008 | Rostalski et al. |
| 7,388,648 B2 | 6/2008 | Lof et al. |
| 7,394,521 B2 | 7/2008 | Van Santen et al. |
| 7,399,978 B2 | 7/2008 | Van Santen et al. |
| 7,436,486 B2 | 10/2008 | Hirukawa |
| 7,436,487 B2 | 10/2008 | Mizutani et al. |
| 7,442,908 B2 | 10/2008 | Schuster |
| 7,446,851 B2 | 11/2008 | Hirukawa |
| 7,456,929 B2 | 11/2008 | Shibuta |
| 7,460,207 B2 | 12/2008 | Mizutani et al. |
| 7,482,611 B2 | 1/2009 | Lof et al. |
| 7,486,385 B2 | 2/2009 | Ebihara |
| 7,495,840 B2 | 2/2009 | Schuster |
| 7,505,111 B2 | 3/2009 | Hirukawa et al. |
| 7,514,699 B2 | 4/2009 | Neijzen et al. |
| 7,528,931 B2 | 5/2009 | Modderman |
| 7,545,479 B2 | 6/2009 | Binnard |
| 7,589,821 B2 | 9/2009 | Hirukawa |
| 7,589,822 B2 | 9/2009 | Shibazaki |
| 7,593,092 B2 | 9/2009 | Lof et al. |
| 7,593,093 B2 | 9/2009 | Lof et al. |
| 7,639,343 B2 | 12/2009 | Hirukawa |
| 8,027,027 B2 | 9/2011 | Ebihara |

(56) References Cited

U.S. PATENT DOCUMENTS

| | | |
|---|---|---|
| 8,045,136 B2 | 10/2011 | Shibazaki |
| 8,233,137 B2 | 7/2012 | Modderman |
| 2001/0019250 A1 | 9/2001 | Lee |
| 2001/0030522 A1 | 10/2001 | Lee |
| 2002/0017889 A1 | 2/2002 | Lee |
| 2002/0018192 A1 | 2/2002 | Nishi |
| 2002/0020821 A1 | 2/2002 | Van Santen et al. |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2002/0176082 A1 | 11/2002 | Sakakibara et al. |
| 2002/0196421 A1 | 12/2002 | Tanaka et al. |
| 2003/0025890 A1 | 2/2003 | Nishinaga |
| 2003/0030916 A1 | 2/2003 | Suenaga |
| 2003/0075871 A1 | 4/2003 | Shinozaki |
| 2003/0076482 A1 | 4/2003 | Inoue |
| 2003/0117596 A1 | 6/2003 | Nishi |
| 2003/0128348 A1 | 7/2003 | Nishi |
| 2003/0174408 A1 | 9/2003 | Rostalski et al. |
| 2004/0000627 A1 | 1/2004 | Schuster |
| 2004/0004757 A1 | 1/2004 | Schuster |
| 2004/0032575 A1 | 2/2004 | Nishi et al. |
| 2004/0039486 A1 | 2/2004 | Bacchi et al. |
| 2004/0075895 A1 | 4/2004 | Lin |
| 2004/0095085 A1 | 5/2004 | Lee |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0120051 A1 | 6/2004 | Schuster |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0233407 A1 | 11/2004 | Nishi et al. |
| 2004/0239904 A1 | 12/2004 | Nishinaga |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0002009 A1 | 1/2005 | Lee |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0094125 A1 | 5/2005 | Arai |
| 2005/0100745 A1 | 5/2005 | Lin et al. |
| 2005/0106512 A1 | 5/2005 | Endo et al. |
| 2005/0110973 A1 | 5/2005 | Streefkerk et al. |
| 2005/0111108 A1 | 5/2005 | Schuster |
| 2005/0117134 A1 | 6/2005 | Nagasaka et al. |
| 2005/0117135 A1 | 6/2005 | Verhoeven et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0128445 A1 | 6/2005 | Hoogendam et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0136361 A1 | 6/2005 | Endo et al. |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0174550 A1 | 8/2005 | Streefkerk et al. |
| 2005/0175776 A1 | 8/2005 | Streefkerk et al. |
| 2005/0175940 A1 | 8/2005 | Dierichs |
| 2005/0178944 A1 | 8/2005 | Schuster |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0231813 A1 | 10/2005 | Rostalski et al. |
| 2005/0231814 A1 | 10/2005 | Rostalski et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0248856 A1 | 11/2005 | Omura et al. |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0259236 A1 | 11/2005 | Straaijer |
| 2005/0263068 A1 | 12/2005 | Hoogendam et al. |
| 2005/0264774 A1 | 12/2005 | Mizutani et al. |
| 2005/0264778 A1 | 12/2005 | Lof et al. |
| 2005/0270505 A1 | 12/2005 | Smith |
| 2006/0007419 A1 | 1/2006 | Streefkerk et al. |
| 2006/0023184 A1 | 2/2006 | Coon et al. |
| 2006/0023186 A1 | 2/2006 | Binnard |
| 2006/0023188 A1 | 2/2006 | Hara |
| 2006/0023189 A1 | 2/2006 | Lof et al. |
| 2006/0028632 A1 | 2/2006 | Hazelton et al. |
| 2006/0033899 A1 | 2/2006 | Hazelton et al. |

(56) References Cited

U.S. PATENT DOCUMENTS

| | | |
|---|---|---|
| 2006/0077367 A1 | 4/2006 | Kobayashi et al. |
| 2006/0082741 A1 | 4/2006 | Van Der Toorn et al. |
| 2006/0098180 A1 | 5/2006 | Bleeker |
| 2006/0103820 A1 | 5/2006 | Donders et al. |
| 2006/0114445 A1 | 6/2006 | Ebihara |
| 2006/0119820 A1 | 6/2006 | Hirukawa |
| 2006/0126037 A1 | 6/2006 | Jansen et al. |
| 2006/0126043 A1 | 6/2006 | Mizutani et al. |
| 2006/0126044 A1 | 6/2006 | Mizutani et al. |
| 2006/0132733 A1 | 6/2006 | Modderman |
| 2006/0132737 A1 | 6/2006 | Magome et al. |
| 2006/0132738 A1 | 6/2006 | Hirukawa |
| 2006/0132739 A1 | 6/2006 | Ebihara |
| 2006/0132740 A1 | 6/2006 | Ebihara |
| 2006/0152697 A1 | 7/2006 | Poon et al. |
| 2006/0158628 A1 | 7/2006 | Liebregts et al. |
| 2006/0164615 A1 | 7/2006 | Hirukawa |
| 2006/0176458 A1 | 8/2006 | Derksen et al. |
| 2006/0209414 A1 | 9/2006 | Van Santen et al. |
| 2006/0227308 A1 | 10/2006 | Brink et al. |
| 2006/0232756 A1 | 10/2006 | Lof et al. |
| 2006/0261288 A1 | 11/2006 | Van Santen |
| 2006/0268250 A1 | 11/2006 | Derksen et al. |
| 2007/0019301 A1 | 1/2007 | Schuster |
| 2007/0040133 A1 | 2/2007 | Lof et al. |
| 2007/0064214 A1 | 3/2007 | Ebihara |
| 2007/0109515 A1 | 5/2007 | Nishi |
| 2007/0115447 A1 | 5/2007 | Hirukawa et al. |
| 2007/0115448 A1 | 5/2007 | Hirukawa et al. |
| 2007/0132970 A1 | 6/2007 | Lof et al. |
| 2007/0132971 A1 | 6/2007 | Sengers et al. |
| 2007/0132979 A1 | 6/2007 | Lof et al. |
| 2007/0188880 A1 | 8/2007 | Schuster |
| 2007/0195300 A1 | 8/2007 | Binnard |
| 2007/0211234 A1 | 9/2007 | Ebihara |
| 2007/0211235 A1 | 9/2007 | Shibazaki |
| 2007/0247722 A1 | 10/2007 | Rostalski et al. |
| 2007/0258064 A1 | 11/2007 | Hirukawa |
| 2007/0263196 A1 | 11/2007 | Hirukawa et al. |
| 2007/0268471 A1 | 11/2007 | Lof et al. |
| 2008/0002166 A1 | 1/2008 | Ebihara |
| 2008/0151203 A1 | 6/2008 | Hirukawa et al. |
| 2008/0180053 A1 | 7/2008 | Lee |
| 2008/0218717 A1 | 9/2008 | Streefkerk et al. |
| 2008/0218726 A1 | 9/2008 | Lof et al. |
| 2009/0002652 A1 | 1/2009 | Lof et al. |
| 2009/0015807 A1 | 1/2009 | Hirukawa et al. |
| 2009/0109413 A1 | 4/2009 | Shibazaki et al. |
| 2009/0184270 A1 | 7/2009 | Lof et al. |
| 2009/0190112 A1 | 7/2009 | Ebihara |
| 2009/0290135 A1 | 11/2009 | Lof et al. |
| 2011/0051104 A1 | 3/2011 | Shibazaki |
| 2011/0058149 A1 | 3/2011 | Shibazaki |
| 2013/0215403 A1 | 8/2013 | Ebihara |
| 2013/0229637 A1 | 9/2013 | Ebihara |
| 2013/0250257 A1 | 9/2013 | Ebihara |

FOREIGN PATENT DOCUMENTS

| | | |
|---|---|---|
| EP | 0 605 103 A1 | 7/1994 |
| EP | 0 834 773 A2 | 4/1998 |
| EP | 1 041 357 A1 | 10/2000 |
| EP | 1 126 510 A1 | 8/2001 |
| EP | 1 306 592 A2 | 5/2003 |
| EP | 1 420 299 A2 | 5/2004 |
| EP | 1 420 300 A2 | 5/2004 |
| EP | 1 494 267 A1 | 1/2005 |
| EP | 1 571 697 A1 | 9/2005 |
| EP | 1 635 382 A1 | 3/2006 |
| EP | 1 713 113 A1 | 10/2006 |
| EP | 1 713 114 A1 | 10/2006 |
| JP | A-57-117238 | 7/1982 |
| JP | A-57-153433 | 9/1982 |
| JP | A-58-202448 | 11/1983 |
| JP | A-59-19912 | 2/1984 |
| JP | A-61-44429 | 3/1986 |
| JP | A-62-65326 | 3/1987 |
| JP | A-62-121417 | 6/1987 |
| JP | A-63-157419 | 6/1988 |
| JP | A-2-166717 | 6/1990 |
| JP | A-04-065603 | 3/1992 |
| JP | A-4-305915 | 10/1992 |
| JP | A-4-305917 | 10/1992 |
| JP | A-5-21314 | 1/1993 |
| JP | A-5-62877 | 3/1993 |
| JP | A-05-175098 | 7/1993 |
| JP | A-5-304072 | 11/1993 |
| JP | A-6-124873 | 5/1994 |
| JP | A-6-168866 | 6/1994 |
| JP | A-6-208058 | 7/1994 |
| JP | A-6-283403 | 10/1994 |
| JP | A-6-349701 | 12/1994 |
| JP | A-7-176468 | 7/1995 |
| JP | A-7-220990 | 8/1995 |
| JP | A-7-335748 | 12/1995 |
| JP | A-07-335748 | 12/1995 |
| JP | A-08-037149 | 2/1996 |
| JP | A-08-136475 | 5/1996 |
| JP | A-8-166475 | 6/1996 |
| JP | A-08-171054 | 7/1996 |
| JP | A-8-316125 | 11/1996 |
| JP | A-08-330224 | 12/1996 |
| JP | A-08-334695 | 12/1996 |
| JP | A-9-50954 | 2/1997 |
| JP | A-9-232213 | 9/1997 |
| JP | A-10-003039 | 1/1998 |
| JP | A-10-020195 | 1/1998 |
| JP | A-10-154659 | 6/1998 |
| JP | A-10-163099 | 6/1998 |
| JP | A-10-214783 | 8/1998 |
| JP | A-10-228661 | 8/1998 |
| JP | A-10-255319 | 9/1998 |
| JP | A-10-303114 | 11/1998 |
| JP | A-10-340846 | 12/1998 |
| JP | A-11-16816 | 1/1999 |
| JP | A-11-135400 | 5/1999 |
| JP | A-11-176727 | 7/1999 |
| JP | A-2000-58436 | 2/2000 |
| JP | A-2000-106340 | 4/2000 |
| JP | A-2000-505958 | 5/2000 |
| JP | A-2000-164504 | 6/2000 |
| JP | A-2000-511704 | 9/2000 |
| JP | A-2001-091849 | 4/2001 |
| JP | A-2001-118773 | 4/2001 |
| JP | B-3203719 | 8/2001 |
| JP | A-2001-241439 | 9/2001 |
| JP | A-2001-267239 | 9/2001 |
| JP | A-2001-313250 | 11/2001 |
| JP | A-2002-14005 | 1/2002 |
| JP | A-2002-134390 | 5/2002 |
| JP | A-2002-305140 | 10/2002 |
| JP | A-2003-17404 | 1/2003 |
| JP | A-2003-249443 | 9/2003 |
| JP | A-2004-165666 | 6/2004 |
| JP | A-2004-172621 | 6/2004 |
| JP | A-2004-193252 | 7/2004 |
| JP | A-2004-207696 | 7/2004 |
| JP | A-2004-289126 | 10/2004 |
| JP | A-2004-289128 | 10/2004 |
| JP | A-2004-349645 | 12/2004 |
| JP | A-2005-236087 | 9/2005 |
| JP | A-2005-259789 | 9/2005 |
| JP | A-2005-268700 | 9/2005 |
| JP | A-2005-268742 | 9/2005 |
| JP | A-2005-536775 | 12/2005 |
| JP | A-2006-509357 | 3/2006 |
| JP | B2-4315198 | 8/2009 |
| WO | WO 98/24115 | 6/1998 |
| WO | WO 98/28665 | 7/1998 |
| WO | WO 98/40791 | 9/1998 |
| WO | WO 98/59364 | 12/1998 |
| WO | WO 99/01797 | 1/1999 |
| WO | WO 99/23692 | 5/1999 |

(56) References Cited

FOREIGN PATENT DOCUMENTS

| | | |
|---|---|---|
| WO | WO 99/49504 | 9/1999 |
| WO | WO 01/35168 A1 | 5/2001 |
| WO | WO 01/84241 A1 | 11/2001 |
| WO | WO 02/084720 A2 | 10/2002 |
| WO | WO 02/091078 A1 | 11/2002 |
| WO | WO 03/077036 A1 | 9/2003 |
| WO | WO 03/077037 A1 | 9/2003 |
| WO | WO 03/085708 A1 | 10/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/090956 A1 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105107 A1 | 12/2004 |
| WO | WO 2004/114380 A1 | 12/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 A2 | 2/2005 |
| WO | WO 2005/010611 A3 | 2/2005 |
| WO | WO 2005/010962 A1 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/048328 A1 | 5/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/062351 A1 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074014 A1 | 8/2005 |
| WO | WO 2005/074606 A2 | 8/2005 |
| WO | WO 2005/076084 A1 | 8/2005 |
| WO | WO 2005/076321 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Mar. 6, 2012 Office Action issued in U.S. Appl. No. 12/461,244.
Jan. 24, 2013 Office Action issued in U.S. Appl. No. 11/785,539.
Jan. 28, 2013 Office Action issued in U.S. Appl. No. 12/453,386.
Jan. 31, 2013 Office Action issued in U.S. Appl. No. 12/923,823.
Jan. 31, 2013 Office Action issued in U.S Appl. No. 12/659,894.
Feb. 4, 2013 Office Action issued in U.S Appl. No. 11/812,925.
Feb. 5, 2013 Office Action issued in U.S Appl. No. 11/812,919.
Feb. 27, 2013 Office Action issued in Taiwanese Patent Application No. 098146233 (with translation).
Mar. 3, 2011 Office Action in European Application No. 04721260.0.
Mar. 28, 2011 Search Report in European Application No. 10185953.6.
Mar. 28, 2011 Search Report in European Application No. 10185992.4.
May 7, 2012 Office Action issued in U.S. Appl. No. 11/889,733.
May 31, 2011 Notice of Allowance in Japanese Application No. 2008-111219, with translation.
Apr. 29, 2011 Office Action in Korean Application No. 2006-7012095, with translation.
Apr. 29, 2011 Office Action in Korean Application No. 2011-7003587, with translation.
Apr. 29, 2011 Office Action in Korean Application No. 2011-7003625, with translation.
Apr. 29, 2011 Office Action in Korean Application No. 2011-7003626, with translation.
May 4, 201 1 Office Action in Korean Application No. 2011-7003627, with translation.
May 4, 2011 Office Action in Korean Application No. 2011-7003628, with translation.
Jun. 14, 2012 Office Action issued in U.S. Appl. No. 12/659,894.
Jun. 14, 2012 Office Action issued in U.S. Appl. No. 11/812,925.
Jun. 15, 2012 Office Action issued in U.S. Appl. No. 11/812,919.
Jun. 15, 2012 Office Action issued in U.S. Appl. No. 12/923,823.
Jun. 20, 2012 Office Action issued in U.S. Appl. No. 11/785,539.
Jun. 21, 2012 Office Action issued in U.S. Appl. No. 12/453,386.
Jul. 12, 2012 Office Action issued in U.S. Appl. No. 12/923,718.
Jun. 19, 2012 Office Action issued in Korean Application No. 2012-7006824 (with English translation).
May 30, 2012 Office Action issued in Korean Application No. 2011-7014236 (with English translation).
Jun. 28, 2013 Office Action issued in Taiwanese Patent Application No. 099136459 (with translation).
Aug. 10, 2012 Office Action issued in U.S. Appl. No. 13/435,780, filed Mar. 30, 2012.
Sep. 1, 2011 Office Action issued in U.S. Appl. No. 11/812,919.
Sep. 1, 2011 Office Action issued in U.S. Appl. No. 11/812,925.
Sep. 6, 2011 Office Action issued in U.S. Appl. No. 12/659,894.
Sep. 29, 2011 Office Action issued in U.S. Appl. No. 12/453,386.
Sep. 25, 2012 Office Action issued in U.S. Appl. No. 12/461,246.
Nov. 5, 2012 Office Action issued in U.S. Appl. No. 12/461,244.
Sep. 7, 2012 Office Action issued in Taiwanese Application No. 94103146 (with English translation).
Oct. 2, 2012 European Search Report issued in EP Application No. 10186134.2.
Oct. 4, 2012 European Search Report issued in EP Application No. 10186140.9.
Oct. 8, 2012 European Search Report issued in EP Application No. 10186153.2.
Oct. 10, 2012 European Search Report issued in EP Application No. 10186147.4.
Emerging Lithographic Technologies VI, Proceedings of SPIE, vol. 4688 (2002), "Semiconductor Foundry, Lithography, and Partners," B.J. Lin, pp. 11-24.
Optical Microlithography XV, Proceedings of SPIE, vd. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of PhotoOptical Instrumentation Engineers, "Resolution enhancement of 157 nm lithography byliquid immersion," M. Switkes et al., pp. 1-4.

(56) References Cited

OTHER PUBLICATIONS

Nikon Corporation, Litho Forum, Jan. 28, 2004, "Update on 193 nm immersion exposure tool," S. Owa et al., 51pages (slides 1-51).
Nikon Corporation, Immersion Lithography Workshop, Dec. 11, 2002, 24 pages (slides 124).
Nikon Corporation, Immersion Workshop, Jan. 27, 2004, "Update on 19 nm immersion exposure tool", S. Owa et al., 38 pages (slides 1-38).
Nikon Corporation, 3$^{rd}$157 nm symposium, Sep. 4, 2002, "Nikon F2 Exposure Tool", Soichi Owa et al., 25 pages (slides 1-25).
Optical Microlithography XVI, Proceedings of SPIE vol. 5040 (2003), "Immersion lithography; its potential performanceand issues", Soichi Owa et al., pp. 724-733.
Nikon Corporation, NGL Workshop, Jul. 10, 2003, "Potential performance and feasibility of immersion lithography", Soichi Owa et al., 33 pages, slides 1-33.
"Ductile Mode Cutting of Optical Glass Using a Flying tool by the Action of Hydrostatic Bearing", Apr. 14, 2003, http://martini.iis.u-tokyo.ac.jp/lab/ductile-j.html. (With Translation).
Dec. 20, 2006 Office Action in U.S. Appl. No. 11/258,846.
Aug. 31, 2007 Notice of Allowance in U.S. Appl. No. 11/258,846.
Sep. 9, 2008 Office Action in U.S. Appl. No. 11/340,680.
Jun. 1, 2009 Office Action in U.S. Appl. No. 11/340,680.
Oct. 23, 2009 Office Action in U.S. Appl. No. 11/340,680.
Mar. 8, 2007 Office Action in U.S. Appl. No. 11/339,683.
Nov. 16, 2007 Office Action in U.S. Appl. No. 11/339,683.
Sep. 19, 2008 Office Action in U.S. Appl. No. 11/339,683.
May 27, 2009 Office Action in U.S. Appl. No. 11/339,683.
Nov. 6, 2009 Notice of Allowance in U.S. Appl. No. 11/339,683.
Sep. 25, 2008 Notice of Allowance in U.S. Appl. No. 11/602,371.
Dec. 3, 2008 Office Action in U.S. Appl. No. 11/785,716.
Sep. 10, 2009 Notice of Allowance in U.S. Appl. No. 11/785,716.
Nov. 18, 2008 Office Action in U.S. Appl. No. 11/889,733.
Aug. 28, 2009 Office Action in U.S. Appl. No. 11/889,733.
Apr. 25, 2008 Communication Pursuant to Art. 94(3) EPC in European Application No. 04 746 097.7.
Nov. 18, 2008 Communication Pursuant to Art. 94(3) EPC in European Application No. 04 746 097.7.
Sep. 7, 2007 Office Action in Chinese Application No. 200480015978 and English Translation.
Dec. 9, 2009 Office Action in Japanese Patent Application No. 2009-044470, with translation.
Mar. 20, 2006 Office Action in U.S. Appl. No. 11/237,721.
Jun. 14, 2007 Office Action in U.S. Appl. No. 11/237,721.
Dec. 20, 2007 Notice of Allowance in U.S. Appl. No. 11/237,721.
Mar. 20, 2006 Office Action in U.S. Appl. No. 11/259,061.
Nov. 24, 2006 Office Action in U.S. Appl. No. 11/259,061.
Jun. 11, 2007 Notice of Allowance in U.S. Appl. No. 11/259,061.
Sep. 6, 2007 Notice of Allowance in U.S. Appl. No. 11/259,061.
Jan. 9, 2009 Office Action in U.S. Appl. No. 11/882,837.
Aug. 18, 2008 Office Action in U.S. Appl. No. 11/785,539.
May 13, 2009 Office Action in U.S. Appl. No. 11/785,539.
May 27, 2009 Office Action in U.S. Appl. No. 11/812,925.
May 29, 2008 Office Action in U.S. Appl. No. 11/798,262.
Oct. 1, 2008 Notice of Allowance in U.S. Appl. No. 11/798,262.
Feb. 6, 2009 Notice of Allowance in U.S. Appl. No. 11/798,262.
Feb. 10, 2009 Office Action in U.S. Appl. No. 11/822,804.
Oct. 14, 2009 Office Action in U.S. Appl. No. 11/984,980.
Aug. 2, 2007 Office Action in European Patent Application No. 05 704 182.4.
Sep. 12, 2008 Office Action in European Patent Application No. 05 704 182.4.
Feb. 29, 2008 Australian Office Action in Singapore Patent Application No. 2006050843.
Oct. 29, 2008 Australian Office Action in Singapore Patent Application No. 200605084-3.
Australian Search Report in Singapore Patent Application No. 200605084-3, dated Jul. 10, 2008.
Sep. 9, 2009 Office Action in U.S. Appl. No. 11/812,919.
May 6, 2009 Office Action in U.S. Appl. No. 11/785,860.
Oct. 7, 2008 Office Action in U.S. Appl. No. 11/785,860.
Dec. 7, 2009 Notice of Allowance in U.S. Appl. No. 11/785,860.
Sep. 3, 2008 Office Action in U.S. Appl. No. 10/588,029.
May 5, 2009 Notice of Allowance in U.S. Appl. No. 10/588,029.
Feb. 27, 2009 Office Action in Chinese Application No. 200480009702.0, with translation.
Sep. 1, 2008 Search Report in European Application No. 04721260.0.
Sep. 12, 2008 Austrian Search Report and Office Action in Singapore Patent Application No. 2007175649.
Mar. 13, 2009 Office Action in Chinese Application No. 2005800022692, with translation.
May 16, 2008 Office Action in Chinese Application No. 2005800022692, with translation.
Dec. 19, 2007 Office Action in Indonesian Patent Application No. W-002005 02693, with translation.
May 10, 2009 Office Action in Israeli Patent Application No. 170735, withtranslation.
Nov. 21, 2008 Austrian Search Report and Written Opinion in Singapore Patent Application No. 2007175623.
Jun. 4, 2008 Australian Search Report and Office Action in Singapore Patent Application No. 200717561-5.
Jun. 3, 2008 Australian Search Report and Office Action in Singapore Patent Application No. 2007175763.
Jan. 27, 2009 Office Action in Japanese Patent Application No. 2006-506525, with translation.
Dec. 2, 2009 Office Action in U.S. Appl. No. 11/822,804.
Jan. 15, 2010 Notice of Allowance in U.S. Appl. No. 11/785,716.
Jan. 4, 2008 Search Report in European Patent Application No. 04746097.7.
Jan. 28, 2010 Office Action in U.S. Appl. No. 11/889,733.
Apr. 23, 2010 Notice of Allowance in U.S. Appl. No. 11/340,680.
Mar. 30, 2010 Notice of Allowance in U.S. Appl. No. 11/339,683.
Mar. 10, 2010 Notice of Allowance in U.S. Appl. No. 11/785,860.
Apr. 23, 2010 Office Action in U.S. Appl. No. 11/812,919.
Jan. 27, 2010 Office Action in U.S. Appl. No. 11/882,837.
Feb. 4, 2010 Office Action in U.S. Appl. No. 11/785,539.
Mar. 29, 2010 Office Action in U.S. Appl. No. 11/812,925.
May 14, 2010 Notice of Allowance in U.S. Appl. No. 11/984,980.
Feb. 20, 2007 Office Action in U.S. Appl. No. 11/147,285.
Nov. 16, 2007 Office Action in U.S. Appl. No. 11/147,285.
Aug. 7, 2008 Office Action in U.S. Appl. No. 11/147,285.
Jan. 22, 2009 Office Action in U.S. Appl. No. 11/147,285.
Nov. 3, 2009 Notice of Allowance in U.S. Appl. No. 11/147,285.
Feb. 24, 2010 Notice of Allowance in U.S. Appl. No. 11/147,285.
Aug. 2, 2007 Office Action in U.S. Appl. No. 11/356,000.
Apr. 29, 2008 Office Action in U.S. Appl. No. 11/655,083.
Jan. 15, 2009 Office Action in U.S. Appl. No. 11/655,083.
Aug. 7, 2009 Notice of Allowance in U.S. Appl. No. 11/655,083.
Oct. 1, 2008 Office Action in U.S. Appl. No. 11/822,807.
U.S. Appl. No. 12/659,894, filed Mar. 24, 2010.
Feb. 17, 2010 Office Action in U.S. Appl. No. 11/785,716.
Mar. 2, 2010 Notice of Allowance in U.S. Appl. No. 11/785,716.
Mar. 11, 2010 Supplemental Notice of Allowability in U.S. Appl. No. 11/785,716.
Jun. 18, 2010 Notice of Allowance in U.S. Appl. No. 11/785,716.
Apr. 14, 2010 Office Action in Chinese Application No. 200810184648.3, with translation.
Jul. 28, 2009 Office Action in U.S. Appl. No. 11/822,807.
Mar. 3, 2010 Office Action in U.S. Appl. No. 11/822,807.
Apr. 28, 2009 Office Action in U.S. Appl. No. 12/010,824.
Dec. 14, 2009 Notice of Allowance in U.S. Appl. No. 12/010,824.
Mar. 23, 2010 Notice of Allowance in U.S. Appl. No. 12/010,824.
Oct. 10, 2006 Office Action in U.S. Appl. No. 11/338,826.
Jul. 5, 2007 Office Action in U.S. Appl. No. 11/338,826.
Nov. 16, 2007 Office Action in U.S. Appl. No. 11/338,826.
Jun. 27, 2008 Notice of Allowance in U.S. Appl. No. 11/338,826.
Feb. 20, 2007 Office Action in U.S. Appl. No. 11/339,505.
Nov. 5, 2007 Office Action in U.S. Appl. No. 11/339,505.
Jun. 9, 2008 Notice of Allowance in U.S. Appl. No. 11/339,505.
Jul. 19, 2007 Office Action in U.S. Appl. No. 11/656,550.
Apr. 17, 2008 Office Action in U.S. Appl. No. 11/656,550.
Nov. 12, 2008 Notice of Allowance in U.S. Appl. No. 11/656,550.

(56) References Cited

OTHER PUBLICATIONS

Aug. 29, 2008 Office Action in U.S. Appl. No. 11/878,076.
May 8, 2009 Notice of Allowance in U.S. Appl. No. 11/878,076.
May 14, 2008 Office Action in U.S. Appl. No. 11/665,273.
Jul. 25, 2008 Notice of Allowance in U.S. Appl. No. 11/665,273.
Dec. 9, 2009 Notice of Allowance in Japanese Applbation No. 2005-507235, with translation.
Mar. 30, 2010 Notice of Allowance in Japanese Application No. 2009044470, with translation.
Oct. 5, 2004 International Search Report and Written Opinion in Application No. PCT/JP2004/008595, with tanslation.
Jul. 6, 2009 Communication Under Rule 71(3) in European Application No. 04746097.7.
Sep. 26, 2008 Notice of Allowance in Chinese Application No. 200480015978.X, with translation.
Mar. 31, 2008 Australian Written Opinion (Allowance) in Singapore Application No. 200605084-3.
May 17, 2005 International Search Report and Written Opinion in Application No. PCT/JP2005/001076, with translation.
Mar. 29, 2007 Search Report in European Application No. 05704182.4.
Jun. 19, 2009 Notice of Allowance in Chinese Application No. 200580002269.2, with translation.
Dec. 13, 2009 Office Action in Israeli Application No. 177221, with translation.
Apr. 28, 2009 Notice of Allowance in Japanese Application No. 2006.506525, with translation.
Mar. 1, 2005 International Search Report and Written Opinion in Application No. PCT/IB04/01259.
Aug. 4, 2009 Austrian Examination Report in Singapore Application No. 2007175613.
Jan. 5, 2007 Austrian Examination Report in Singapore Application No. 200505829-2.
Feb. 9, 2009 Office Action in Japanese Application No. 2004-558437, with translation.
Jul. 27, 2009 Notice of Allowance in Japanese Application No. 2004558437, with translation.
Feb. 12, 2010 Office Action in Chinese Application No. 2008101751375, with translation.
Jan. 14, 2010 Office Action in Taiwanese Application No. 09920027510, with translation.
Jun. 5, 2007 Search Report in European Application No. 03777352.0.
Apr. 17, 2009 Office Action in European Application No. 03777352.0.
Mar. 2, 2007 Office Action in Chinese Application No. 200380105467.2, with translation.
Feb. 1, 2008 Office Action in Chinese Application No. 200380105467.2, with translation.
Aug. 15, 2008 Notice of Allowance in Chinese Application No. 200380105467.2, with translation.
Dec. 10, 2007 Austrian Invitation to Respond to Written Opinion in Singapore Application No. 2005036199.
Oct. 9, 2008 Austrian Notice of Allowance in Singapore Application No. 200503619-9.
Oct. 15, 2008 Austrian Search and Examination Report in Singapore Application No. 2007175649.
Dec. 18, 2008 Austrian Invitation to Respond to Written Opinion in Singapore Application No. 200717503.
Aug. 4, 2009 Austrian Examination Report in Singapore Application No. 2007175623.
Jul. 4, 2008 Australian Search and Examination Report in Singapore Application No. 200717561-5.
Jul. 2, 2008 Australian Search and Examination Report in Singapore Application No. 200717576-3.
Nov. 25, 2008 Office Action and Australian Examination Report in Singapore Application No. 2006050843.
Jul. 7, 2010 Notice of Allowance in U.S. Appl. No. 11/785,860.
Aug. 3, 2010 Notice of Allowance in U.S. Appl. No. 11/147,285.
Apr. 6, 2004 International Search Report in Application No. PCT/JP03/15675, with translation.
Sep. 1, 2010 Notice of Allowance in U.S. Appl. No. 11/339,683.
Aug. 10, 2010 Communication Under Rule 71(3) EPC in European Application No. 05704182.4.
Sep. 9, 2010 Notice of Allowance in U.S. Appl. No. 11/340,680.
Oct. 4, 2010 Notice of Allowance in U.S. Appl. No. 11/785,860.
Oct. 7, 2010 Notice of Allowance in U.S. Appl. No. 11/984,980.
Oct. 21, 2010 Notice of Allowance in U.S. Appl. No. 11/785,716.
Oct. 13, 2010 European Search Report in European Application No. 09015888.2.
Nov. 1, 2010 Office Action in U.S. Appl. No. 11/785,539.
Dec. 13, 2010 Notice of Allowance in U.S. Appl. No. 11/340,680.
Mar. 23, 2011 Office Action in Korean Application No. 2009-7023978, with translation.
Mar. 23, 2011 Office Action in Korean Application No. 2010-7000875, with translation.
Mar. 23, 2011 Office Action in Korean Application No. 2010-7023716, with translation.
Mar. 23, 2011 Office Action in Korean Application No. 2010-7023718, with translation.
Apr. 12, 2011 Office Action in Japanese Application No. 2005-517477, with translation.
Oct. 21, 2011 Office Action issued in U.S. Appl. No. 11/882,837.
Oct. 26, 2011 Office Action issued in U.S. Appl. No. 11/785,539.
Oct. 21, 2011 Office Action issued in U.S. Appl. No. 11/889,733.
Oct. 14, 2011 Office Action issued in U.S. Appl. No. 12/382,807.
Jan. 7, 2011 Office Action in Korean Application No. 2005-7023089, with translation.
Jul. 9, 2013 Office Action issued in Taiwanese Patent Application No. 098115103 (with Translation).
Aug. 1, 2013 Office Action issued in U.S. Appl. No. 12/453,386.
Aug. 6, 2013 Office Action issued in U.S. Appl. No. 11/785,539.
Aug. 6, 2013 Office Action issued in U.S. Appl. No. 11/812,925.
Aug. 21, 2013 Office Action issued in U.S. Appl. No. 12/923,823.
Aug. 21, 2013 Advisory Action issued in U.S. Appl. No. 13/435,780.
Mar. 19, 2013 Office Action issued in Taiwanese Patent Application No. 098146230 (with translation).
Apr. 11, 2013 Office Action issued in U.S. Appl. No. 13/435,780.
Apr. 23, 2013 Office Action issued in Japanese Patent Application No. 2011-112549 (with translation).
Mar. 1, 2011 Office Action in U.S. Appl. No. 11/812,919.
Dec. 21, 2010 Notice of Allowance in U.S. Appl. No. 11/984,980.
Jan. 5, 2011 Office Action in U.S. Appl. No. 11/812,925.
Dec. 20, 2010 Office Action in Korean Application No. 2005-7019366, with translation.
Jan. 17, 2012 Office Action issued in U.S. Appl. No. 12/461,246.
Dec. 9, 2011 Office Action issued in U.S. Appl. No. 11/822,807.
Jan. 9, 2014 Office Action issued in U.S. Appl. No. 13/946,317.
Jan. 16, 2014 Office Action issued in U.S. Appl. No. 11/812,925.
Jan. 16, 2014 Office Action issued in U.S. Appl. No. 11/812,919.
Jan. 16, 2014 Office Action issued in U.S. Appl. No. 13/435,780.
Jan. 17, 2014 Office Action issued in U.S. Appl. No. 11/785,539.
Sep. 23, 2013 Office Action issued in U.S. Appl. No. 12/923,783.
Oct. 2, 2013 Office Action issued in U.S. Appl. No. 12/923,784.
Oct. 2, 2013 Office Action issued in U.S. Appl. No. 12/923,785.
Oct. 2, 2013 Office Action issued in U.S. Appl. No. 13/449,430.
Oct. 10, 2013 Office Action issued in U.S. Appl. No. 13/137,753.
Oct. 11, 2013 Office Action issued in U.S. Appl. No. 12/923,786.
Oct. 11, 2013 Office Action issued in U.S. Appl. No. 13/852,807.
Oct. 16, 2013 Office Action issued in U.S. Appl. No. 13/853,643.
Oct. 21, 2013 Office Action issued in U.S. Appl. No. 13/853,319.

* cited by examiner

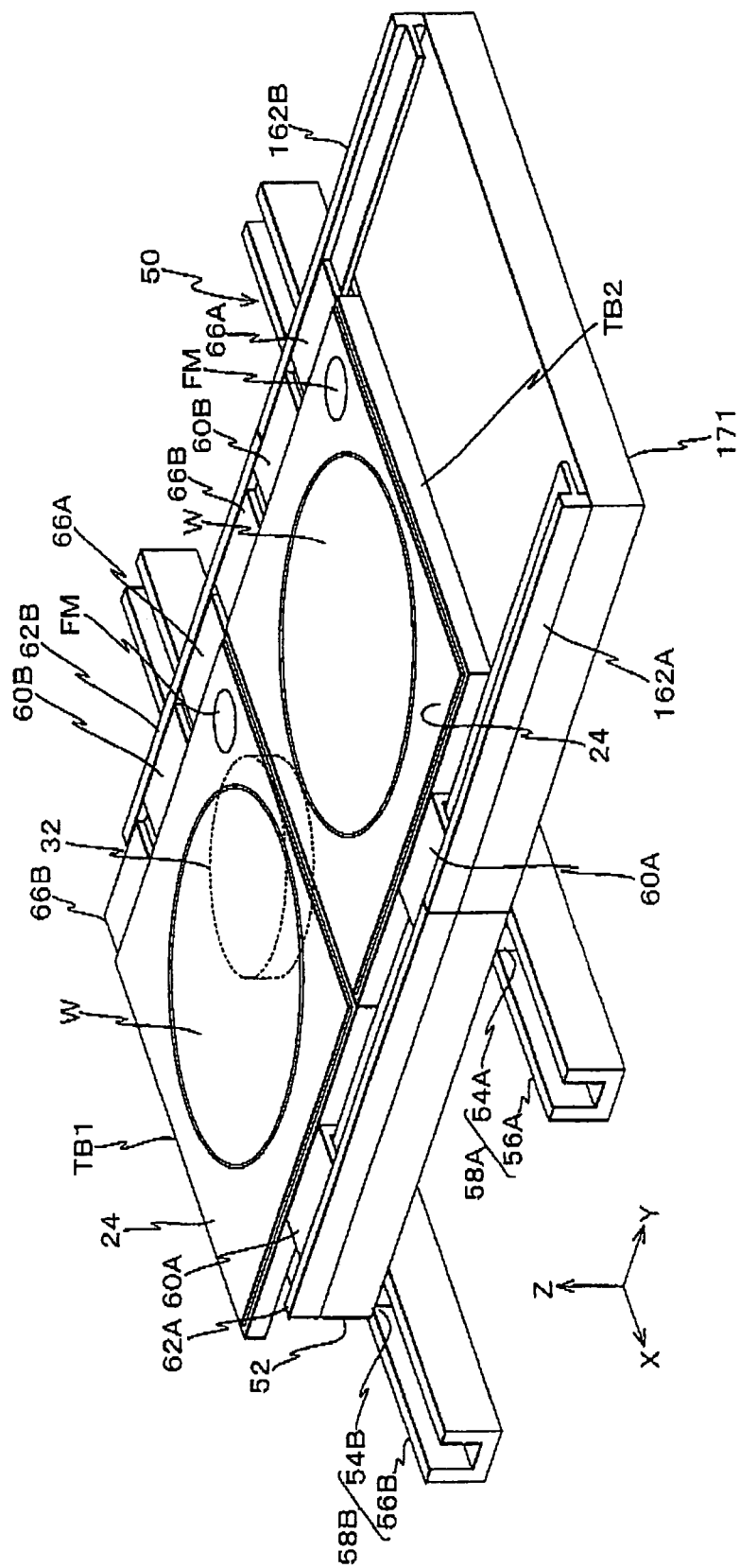

EXPOSURE APPARATUS, AND DEVICE MANUFACTURING METHOD

CROSS-REFERENCE TO RELATED APPLICATIONS

This is a divisional of U.S. patent application Ser. No. 11/340,680 filed Jan. 27, 2006 (now U.S. Pat. No. 8,018,575), which in turn is a divisional of U.S. patent application Ser. No. 11/258,846 filed Oct. 27, 2005 (now U.S. Pat. No. 7,321, 419), which in turn is a continuation of International Application PCT/JP2004/008595, with an international filing date of Jun. 18, 2004. The disclosures of these applications are hereby incorporated herein by reference in their entireties.

BACKGROUND OF THE INVENTION

1. Field of the Invention

The present invention relates to exposure apparatus, and device manufacturing methods, and more particularly to an exposure apparatus used in a lithography process where electronic devices such as semiconductor devices, liquid crystal display devices, or the like is manufactured, and a device manufacturing method that uses the exposure apparatus.

2. Description of the Related Art

In a lithography process for producing electronic devices such as semiconductor devices (integrated circuits), liquid crystal display devices, or the like, projection exposure apparatus are used that transfer the image of a pattern formed on a mask or a reticle (hereinafter generally referred to as a 'reticle') via a projection optical system onto each of the shot areas of a photosensitive substrate (hereinafter referred to as a 'substrate' or a 'wafer') such as a wafer, a glass plate, or the like whose surface is coated with a resist (photosensitive agent). As this type of projection exposure apparatus, conventionally, a reduction projection exposure apparatus by a step-and-repeat method (the so-called stepper) has been frequently used. However, recently, a projection exposure apparatus by a step-and-scan method (the so-called scanning stepper) that performs exposure by synchronously scanning the reticle and the wafer is also gathering attention.

The resolution of the projection optical system equipped in the exposure apparatus becomes higher when the wavelength (hereinafter also referred to as 'exposure wavelength') of the exposure light used becomes shorter, or when the numerical aperture (NA) of the projection optical system becomes larger. Therefore, the exposure wavelength used in the projection exposure apparatus is becoming shorter each year due to finer integrated circuits, along with the increase in the numerical aperture of the projection optical system. The exposure wavelength currently mainly used is 248 nm of the KrF excimer laser, however, a shorter wavelength of 193 nm of the ArF excimer laser has also been put to practical use.

In addition, along with resolution, depth of focus (DOF) is also important when exposure is performed. Resolution R and depth of focus δ can be expressed as in the equations below.

$$R = k_1 \cdot \lambda / NA \quad (1)$$

$$\delta = k_2 \cdot \lambda / NA^2 \quad (2)$$

In this case, λ is the exposure wavelength, NA is the numerical aperture of the projection optical system, and $k_1$ and $k_2$ are process coefficients. From equations (1) and (2), it can be seen that when exposure wavelength λ is shortened and numerical aperture NA is enlarged (increased NA) to increase resolution, depth of focus δ becomes narrow. In a projection exposure apparatus, when exposure is performed, an autofocus method is used to make the surface of the wafer match the image plane of the projection optical system. Accordingly, it is desirable for depth of focus δ to have a certain amount of width. Therefore, methods have been proposed in the past to substantially widen the depth of focus, such as the phase shift reticle method, the modified illumination method, the multi-layer resist method, and the like.

As is described above, in the conventional projection exposure apparatus, the depth of focus is becoming narrow due to the shorter exposure wavelength and the increased numerical aperture. And, in order to cope with higher integration, the exposure wavelength is presumed to be shorter in the future. If such a situation continues, the depth of focus may become so small that margin shortage may occur during the exposure operation.

Therefore, as a method of substantially shortening the exposure wavelength while increasing (widening) the depth of focus when compared with the depth of focus in the air, an immersion exposure method (hereinafter also appropriately referred to as 'immersion method') has been proposed. In the immersion method, resolution is improved by filling the space between the end surface of the projection optical system and the wafer surface with liquid such as water or an organic solvent to make use of the fact that the wavelength of the exposure light in the liquid becomes 1/n of the wavelength in the air (n is the refractive index of the liquid which is normally around 1.2 to 1.6). In addition, in the immersion method, the depth of focus is substantially increased n times when compared with the case where the same resolution is obtained by a projection optical system (supposing that such a projection optical system can be made) that does not employ the immersion method. That is, the depth of focus is substantially increased n times than that in the air.

However, in the case the immersion method above is merely applied to a projection exposure apparatus by the step-and-repeat method, the liquid spills from the space between the projection optical system and the wafer when the wafer is moved in between shots by a step movement to the exposure position for the next shot area after exposure of a shot area has been completed. Therefore, the liquid has to be supplied again, and the recovery of the liquid could also be difficult. In addition, in the case when the immersion method is applied to a projection exposure apparatus by the step-and-scan method, because exposure is performed while moving the wafer, the liquid has to be filled in the space between the projection optical system and the wafer while the wafer is being moved.

Considering such points, a proposal has been recently made on 'an invention related to a projection exposure method and a unit where a predetermined liquid flows along the moving direction of a substrate, so that the liquid fills in the space between the end portion of an optical element on the substrate side of a projection optical system and the surface of the substrate when the substrate is moved in a predetermined direction,' (for example, refer to patent document 1 below).

Besides such a proposal, as a proposal for improving resolution as in the immersion exposure method, a lithography system is known that places a solid immersion lens in the section between a projection lithography lens system (projection optical system) and a sample (for example, refer to patent document 2 below).

According to the invention disclosed in patent document 1 below, exposure with high resolution and a larger depth of focus than the depth of focus in the air can be performed by the immersion method, and the liquid can also be filled in the space between projection optical system and the substrate in a stable manner, or in other words, can be held, even when the projection optical system and the wafer relatively moves.

However, in the invention disclosed in patent document 1 below, because the supply piping, the recovery piping, and the like are arranged outside the projection optical system, the degree of freedom is limited for peripherals such as sensors of various kinds like a focus sensor or an alignment sensor that have to be arranged around the projection optical system.

In addition, in the invention according to patent document 1 below, in the case there is a flow in the liquid filled in the space between the projection optical system and the substrate, when the liquid is irradiated by the exposure light on exposure, temperature inclination or pressure inclination relative to the direction of the flow may occur within the projection area of the pattern in the space between the projection optical system and the substrate. Especially when the space in between the projection optical system and the substrate is large, or in other words, the layer of liquid is thick, such temperature inclination or pressure inclination could be the cause of aberration such as inclination of image plane, which could lead to partial deterioration in the transfer accuracy of the pattern, which in turn could be the cause of deterioration in the line width uniformity of the transferred image of the pattern. Accordingly, the layer of liquid is preferably thin. However, in this case, the space in between the projection optical system and the substrate becomes narrow, which makes it difficult to arrange a focus sensor.

In addition, in the invention according to patent document 1 below, it is difficult to recover the liquid completely, and the probability was high for the liquid used for immersion to remain on the wafer after exposure. In such a case, temperature distribution in the atmosphere or a refractive index change in the atmosphere occurs by the heat of vaporization generated when the remaining liquid evaporates, and these phenomena could be the cause of measurement errors in a laser interferometer system that measures the position of the stage on which the wafer is mounted. Furthermore, the remaining liquid on the wafer could move to the back of the wafer, which could make the wafer stick to the carrier arm and difficult to separate.

Meanwhile, in the lithography system according to patent document 2 below, the distance between the solid immersion lens (hereinafter shortened appropriately as 'SIL') and the sample is maintained at around 50 nm or under. However, in the lithography system in the near future whose target is to transfer and form a fine pattern onto a sample (such as a wafer) at a line width of around 70 nm or under, when an air layer whose thickness is 50 nm exists between the SIL and the sample, it becomes difficult to obtain sufficient resolution in the image of the fine pattern referred to above. That is, in order to obtain sufficient resolution in the fine pattern above, the distance between the SIL and the sample has to be maintained at a maximum of 30 nm or under.

However, in the lithography system according to patent document 2 below, because a configuration using air bearings is employed to maintain the distance between the SIL and the sample, it is difficult to obtain sufficient vibration damping due to the nature of air bearings. As a result, the distance between the SIL and the sample could not be maintained at 30 nm or under.

As is described, in the conventional examples disclosed in patent documents 1 and 2 below and the like, various points are found that should be improved.

Patent Document 1: the pamphlet of International Publication Number WO99/49504

Patent Document 2: the description of U.S. Pat. No. 5,121,256

SUMMARY OF THE INVENTION

The present invention was made under such circumstances, and has as its first object to provide an exposure apparatus that can transfer a pattern onto a substrate almost free from defocus, without necessarily having to arrange a focal position detection system.

In addition, the second object of the present invention is to provide an exposure apparatus suitable for the immersion method that has a plurality of tables.

In addition, the third object of the present invention is to provide a device manufacturing method that can improve the productivity of highly integrated microdevices.

According to a first aspect of the present invention, there is provided a first exposure apparatus that illuminates a pattern with an energy beam and transfers the pattern onto a substrate via a projection optical system, the exposure apparatus comprising: a table on which a substrate is mounted that can move two-dimensionally while holding the substrate; and a hydrostatic bearing unit arranged on an image plane side of the projection optical system, the unit including at least one hydrostatic bearing that supplies liquid in a space between a bearing surface facing the substrate mounted on the table and the substrate so as to maintain the distance between the bearing surface and the surface of the substrate by static pressure of the liquid.

According to the exposure apparatus, the hydrostatic bearing unit maintains the distance between the bearing surface of the hydrostatic bearing and the surface of the substrate in the direction of the optical axis of the projection optical system at a predetermined value. Unlike static gas bearings, hydrostatic bearings utilize the static pressure of the liquid supplied to the space between the bearing surface and the support object (substrate), which is an incompressible fluid, therefore, the rigidity of the bearings is high, and the distance between the bearing surface and the substrate can be maintained both stable and constant. In addition, liquid (e.g., pure water) is higher in viscosity than gas (e.g., air) and is superior in vibration damping when compared with gas. Accordingly, with the exposure apparatus of the present invention, pattern transfer onto a substrate substantially free from defocus can be achieved, without necessarily having to arrange a focal position detection system.

In this case, in a state where higher refractive index fluid than air constantly exists in the space between the projection optical system and the surface of the substrate, exposure of the substrate can be performed with the energy beam via the pattern, the projection optical system, and the high refractive index fluid. In such a case, because the substrate is exposed with the energy beam in a state where the higher refractive index fluid than air constantly exists in the space between the projection optical system and the surface of the substrate, via the pattern, the projection optical system, and the high refractive index fluid, the wavelength of the energy beam on the surface of the substrate can be shortened to $1/n^{th}$ of the wavelength in the air (n is the refractive index of the high refractive index fluid), and furthermore, the depth of focus is widened n times compared to the depth of focus in the air.

In this case, the high refractive index fluid can be liquid.

In this case, liquid for the hydrostatic bearing can be used as the high refractive index fluid to fill the space between the projection optical system and the substrate on the table.

In the first exposure apparatus of the present invention, the at least one hydrostatic bearing can be arranged in a state where a positional relation with the projection optical system is constantly maintained in a direction of an optical axis of the projection optical system.

In the first exposure apparatus of the present invention, an optical member closest to the substrate that constitutes the projection optical system can have a curved surface on the pupil plane side and a planar surface on the image plane side.

In this case, the planar surface on the image plane side of the optical member closest to the substrate constituting the projection optical system can be substantially co-planar with the bearing surface of the hydrostatic bearing. In such a case, for example, it becomes possible to maintain the distance between the optical member and the substrate at around 10 µm. Especially when the space between the projection optical system and the surface of the substrate is filled with the high refractive index fluid, the amount of the high refractive index fluid consumed will be extremely small, and the image forming quality of the pattern image will be less affected by the refractive index change (caused by temperature or the like) of the fluid. Further, especially when the high refractive index fluid is liquid, it is advantageous when drying the wafer.

In the first exposure apparatus of the present invention, the hydrostatic bearing unit can supply the liquid to a space between the bearing surface of the at least one hydrostatic bearing and the substrate, and can also drain liquid in the space between the bearing surface and the substrate outside using negative pressure. In such a case, the hydrostatic bearing will have a higher rigidity, and can maintain the distance between the bearing surface and the substrate constantly with more stability.

In this case, the at least one hydrostatic bearing can be arranged in a state surrounding a projection area of the pattern on the substrate.

In this case, as the at least one hydrostatic bearing, a plurality of hydrostatic bearings can be used, and the plurality of hydrostatic bearings can be arranged in a state surrounding the projection area of the pattern on the substrate, or the at least one hydrostatic bearing can be a single bearing that has a bearing surface which surrounds the projection area of the pattern on the substrate.

In the first exposure apparatus of the present invention, in the case the at least one hydrostatic bearing is arranged in a state surrounding the projection area of the pattern on the substrate, on the bearing surface of the hydrostatic bearing, a plurality of ring-shaped grooves can be formed multiply, and the plurality of ring-shaped grooves can contain at least one each of a liquid supply groove and a liquid drainage groove.

In this case, the plurality of grooves can include a liquid supply groove, and at least one each of a liquid drainage groove, the liquid drainage grooves formed on both the outer and inner sides of the liquid supply groove, respectively.

In the first exposure apparatus of the present invention, in the case the at least one hydrostatic bearing is arranged in a state surrounding the projection area of the pattern on the substrate, the exposure apparatus can further comprise: a gap sensor arranged in the hydrostatic bearing that measures the distance between the bearing and the surface of the substrate in at least one measurement point, wherein the hydrostatic bearing unit can adjust at least one of negative pressure for draining the liquid and positive pressure for supplying the liquid, according to measurement values of the gap sensor.

In the first exposure apparatus of the present invention, the exposure apparatus can further comprise: at least one fluid static bearing that is arranged facing the hydrostatic bearing via the table, the fluid static bearing supplying fluid to a space between a bearing surface facing the table and the table so that a gap between the bearing surface and a surface of the table can be maintained by static pressure of the fluid. In such a case, the table and the substrate on the table is consequently held in the vertical direction by the hydrostatic bearing described earlier and the fluid static bearing described above. In this case, for example, the distance between each of the bearing surfaces and the substrate or the table can be maintained stable and constant at around 10 µm or under. Accordingly, the table itself does not have to have high rigidity, which makes it possible to reduce the thickness of the table, and also reduce its weight.

In this case, the fluid static bearing can be a single bearing that has a bearing surface which surrounds an area corresponding to a projection area on the opposite side of a surface of the table where the substrate is mounted.

In this case, a plurality of annular grooves can be multiply formed on the bearing surface of the fluid static bearing, the plurality of grooves containing at least one each of a fluid supply groove and a fluid drainage groove.

In this case, the plurality of grooves can include a fluid supply groove, and at least one each of a fluid drainage groove, the fluid drainage grooves formed on both the outer and inner sides of the fluid supply groove, respectively.

In the first exposure apparatus of the present invention, when the exposure apparatus comprises the fluid static bearing described above, the fluid can be liquid. More specifically, as the fluid static bearing, the hydrostatic bearing can be used. In such a case, the table and the substrate on the table is held in the vertical direction by the liquid, which is an incompressible fluid, therefore, the table and the substrate on the table can be held in a more stable manner. In this case, because the bearings above and below both have high rigidity, the distance between each of the bearing surfaces and the substrate or the table can be maintained constant more stably.

In the first exposure apparatus of the present invention, the distance between the bearing surface and the surface of the substrate can be maintained larger than zero and around 10 µm and under.

In the first exposure apparatus of the present invention, the exposure apparatus can further comprise: a position detection system that detects positional information of the table within a plane where the table moves two-dimensionally as is earlier described.

According to a second aspect of the present invention, there is provided a second exposure apparatus that supplies liquid in a space between a projection optical system and a substrate, illuminates a pattern with an energy beam, and transfers the pattern onto the substrate via the projection optical system and the liquid, the exposure apparatus comprising: a first table where a mount area of the substrate is formed and the surface of an area around the mount area is set substantially flush to the surface of a substrate mounted on the mount area, the first table being movable within an area of a predetermined range that includes a first area containing a position just below the projection optical system where the liquid is supplied and a second area on one side of an axial direction of the first area; a second table whose surface is set substantially flush to the surface of the substrate, the second table being movable independently from the first table within an area including the first area and the second area; and a stage drive system that drives the first table and the second table, and also drives the first table and the second table simultaneously while maintaining a state that is both tables being close together or both tables being in contact in the axial direction, from the second area side toward the first area side in the axial direction on a transition from a first state where one of the tables is positioned at the first area to a second state where the other table is positioned at the first area.

According to the exposure apparatus, on a transition from a first state where one of the tables is positioned at the first area, which includes the position just under the projection optical system where liquid is supplied, to a second state where the other table is positioned at the first area, the stage drive system drives the first table and the second table simultaneously in the axial direction from the second area side toward the first area side while maintaining a state where both tables are close together or both tables are in contact in the axial direction. Therefore, one of the tables is constantly located just under the projection optical system, and the state where an immersion area is formed in the space between the table (the substrate or the periphery of the area where the substrate is mounted) and the projection optical system is maintained, which allows the liquid to be held in the space between the projection optical system and the table and the liquid can be kept from spilling.

In addition, in a lithographic process, by performing exposure using one of the first and second exposure apparatus in the present invention, the pattern can be formed on the substrate with good accuracy, which allows production of higher integrated microdevices with good yield. Accordingly, further from another aspect of the present invention, it can be said that the present invention is a device manufacturing method that uses one of the first and second exposure apparatus in the present invention.

BRIEF DESCRIPTION OF THE DRAWINGS

In the accompanying drawings:

FIG. 10 is a view used to describe an operation of wafer table exchange in the second embodiment.

DESCRIPTION OF THE EMBODIMENTS

First Embodiment

A first embodiment of the present invention will be described below, referring to FIGS. 1 to 6.

Figure 1:
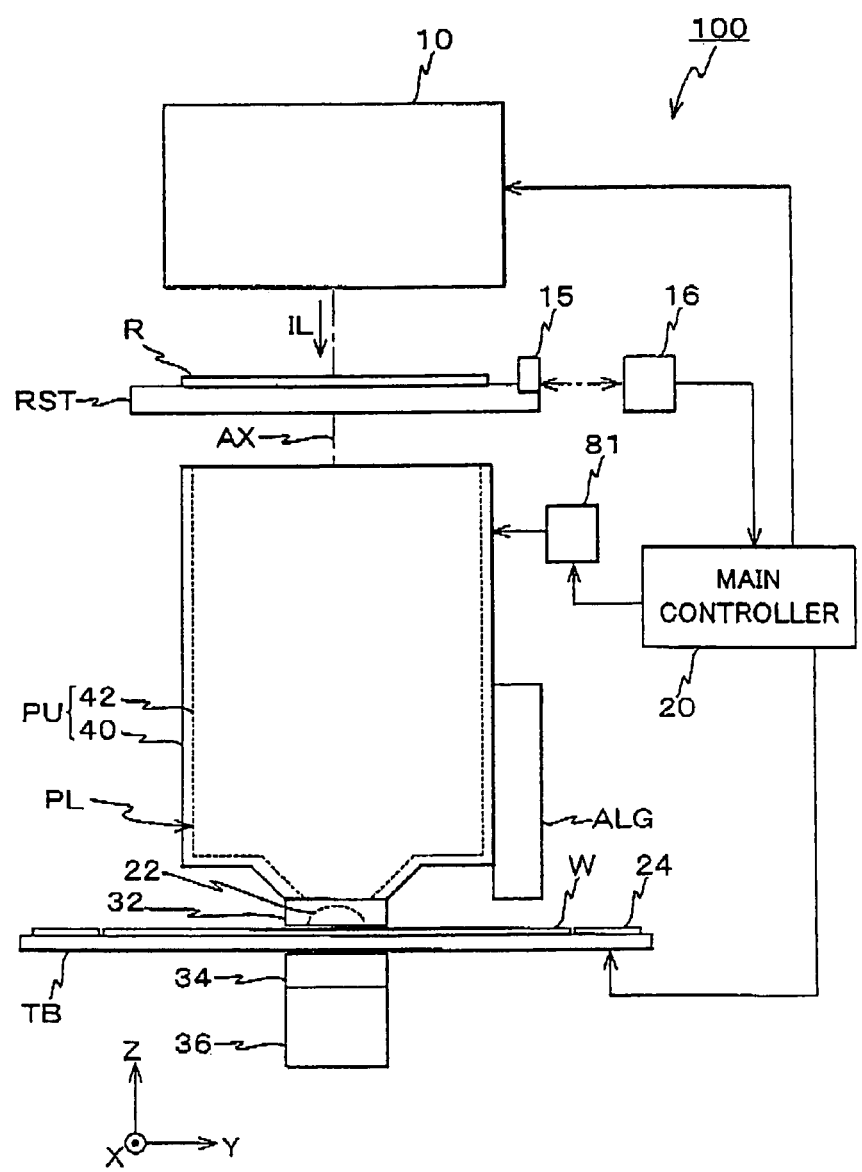
FIG. 1 is a view that schematically shows a configuration of an exposure apparatus in a first embodiment of the present invention.

FIG. 1 shows the entire configuration of an exposure apparatus 100 related to the first embodiment. Exposure apparatus 100 is a projection exposure apparatus (the so-called scanning stepper) by the step-and-scan method. Exposure apparatus 100 is equipped with: an illumination system 10; a reticle stage RST that holds a reticle R serving as a mask; an optical unit PU; a wafer table TB that serves as a table on which a wafer W serving as a substrate is mounted; a main controller 20 that has overall control over the entire apparatus, and the like.

As is disclosed in, for example, Kokai (Japanese Unexamined Patent Publication) No. 2001-313250 and its corresponding U.S. Patent Application Publication No. 2003/0025890, illumination system 10 has an arrangement that includes parts such as a light source, an illuminance uniformity optical system that includes an optical integrator or the like, a beam splitter, a relay lens, a variable ND filter, a reticle blind (none of which are shown), and the like. Besides such an arrangement, illumination system 10 can also have a configuration similar to the illumination system disclosed in, for example, Kokai (Japanese Unexamined Patent Publication) No. 6-349701 and its corresponding U.S. Pat. No. 5,534,970, and the like.

In illumination system 10, an illumination light (exposure light) IL serving as an energy beam illuminates a slit-shaped illumination area set by the reticle blind on reticle R where the circuit pattern or the like is fabricated with substantially uniform illuminance. As illumination light IL, the ArF excimer laser beam (wavelength: 193 nm) is used as an example. As illumination light IL, far ultraviolet light such as the KrF excimer laser beam (wavelength: 248 nm) or bright lines in the ultraviolet region generated by an ultra high-pressure mercury lamp (such as the g-line or the i-line) can also be used. In addition, as the optical integrator, parts such as a fly-eye lens, a rod integrator (an internal reflection type integrator), or a diffraction optical element can be used. As long as the national laws in designated states or elected states, to which this international application is applied, permit, the disclosures of the publications, the corresponding U.S. patent, and the corresponding publication of the U.S. application cited above are fully incorporated herein by reference.

On reticle stage RST, reticle R is fixed, for example, by vacuum suction. Reticle stage RST is structured finely drivable in an XY plane perpendicular to the optical axis of illumination system 10 (coinciding with an optical axis AX of the optical system described later) by a reticle stage drive section 11 (not shown in FIG. 1, refer to FIG. 6) that includes parts such as a linear motor. Reticle stage RST is structured also drivable in a predetermined scanning direction (in this case, a Y-axis direction, which is the lateral direction of the page surface in FIG. 1) at a designated scanning speed.

The position of reticle stage RST within the XY plane is detected constantly with a reticle laser interferometer (hereinafter referred to as a 'reticle interferometer') 16 via a movable mirror 15, at a resolution, for example, around 0.5 to 1 nm. In actual, on reticle stage RST, a movable mirror that has a reflection surface orthogonal to the Y-axis direction and a movable mirror that has a reflection surface orthogonal to an X-axis direction are arranged, and corresponding to these movable mirrors, a reticle Y interferometer and a reticle X interferometer are arranged; however in FIG. 1, such details are representatively shown as movable mirror 15 and reticle interferometer 16. Incidentally, for example, the edge surface of reticle stage RST may be polished in order to form a reflection surface (corresponds to the reflection surface of movable mirror 15). In addition, instead of the reflection surface that extends in the X-axis direction used for detecting the position of reticle stage RST in the scanning direction (the Y-axis direction in this embodiment), at least one corner cubic mirror (such as a retroreflector) may be used. Of the interferometers reticle Y interferometer and reticle X interferometer, one of them, such as reticle Y interferometer, is a dual-axis interferometer that has two measurement axes, and based on the measurement values of reticle Y interferometer, the rotation of reticle stage RST in a θz direction (the rotational direction around a Z-axis) can be measured in addition to the Y position of reticle stage RST.

The positional information on reticle stage RST from reticle interferometer 16 is sent to main controller 20. Main controller 20 drives and controls reticle stage RST via reticle stage drive section 11 (refer to FIG. 6), based on the positional information of reticle stage RST.

Projection unit PU is disposed below reticle stage RST in FIG. 1. Projection unit PU is equipped with a barrel 40, and an optical system 42, which is made up of a plurality of optical elements, or to be more specific, a plurality of lenses (lens elements) that share the same optical axis AX in the Z-axis direction, held at a predetermined positional relationship within the barrel. Further, in the embodiment, a hydrostatic pad 32 serving as a fluid static bearing is integrally attached to the lower end (the tip of barrel 40 that holds the optical element (optical member) closest to the image plane side (wafer W side) constituting optical system 42) of barrel 40, and inside an opening formed in the center of hydrostatic pad 32, a solid immersion lens (hereinafter simply referred to as 'SIL') 22 is arranged (refer to FIG. 3). SIL 22 consists of a plane-convex lens, and its planar surface (hereinafter referred to as a 'lower surface' for the sake of convenience) faces downward and is arranged so that the lower surface is substantially co-planar with the bearing surface of hydrostatic pad 32. SIL 22 is made from a material whose refractive index $n_{SIL}$ is around 2 to 2.5.

In the embodiment, optical system 42 and SIL 22 inside barrel 40 substantially configure a projection optical system consisting of, for example, a both-side telecentric dioptric system that has a predetermined projection magnification (such as ¼ or ⅕ times). Hereinafter, the projection optical system will be described as projection optical system PL.

In this case, when the illumination area of reticle R is illuminated by illumination light IL from illumination system 10, illumination light IL that has passed through reticle R forms a reduced image of the circuit pattern within the illumination area of reticle R (a reduced image of a part of the circuit pattern) on wafer W whose surface is coated with a resist (photosensitive agent), on the irradiation area (hereinafter also referred to as 'exposure area') of the illumination light conjugate with the illumination area, via projection optical system PL.

In addition, although it is omitted in the drawings, among the plurality of lenses making up optical system 42, a plurality of specific lenses operate under the control of an image forming quality correction controller 81 (refer to FIG. 6) based on instructions from main controller 20, so that optical properties (including image forming quality) of projection optical system PL, such as magnification, distortion, coma, and curvature of image plane (including inclination of image plane), and the like can be adjusted.

The configuration and the like of hydrostatic pad 32 and the piping system connecting to hydrostatic pad 32 will be described later in the description.

Figure 2:
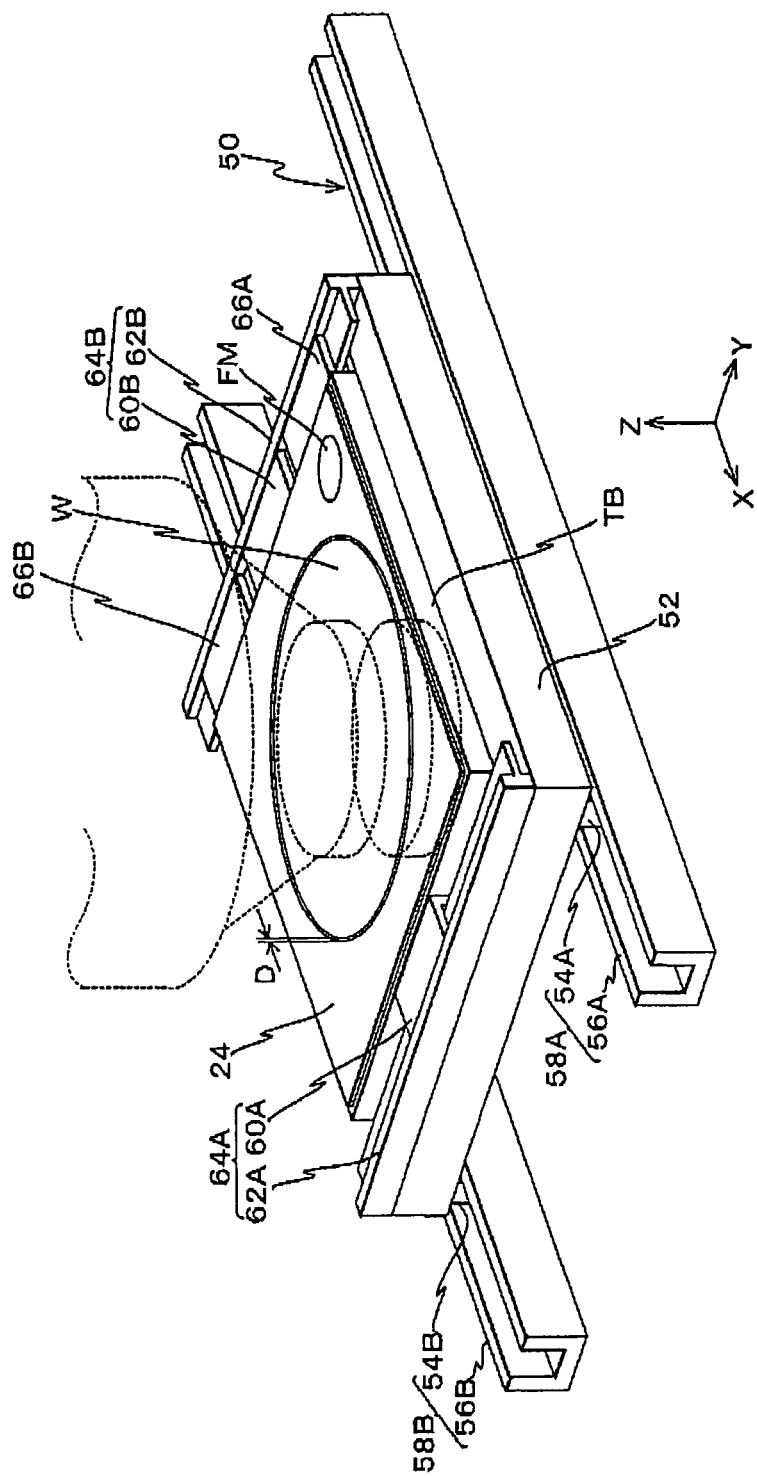
FIG. 2 is a perspective view that shows a configuration of a drive unit with a wafer table TB.

Wafer table TB is constituted by a rectangular plate member, and on its surface, an auxiliary plate 24 is fixed that has a circular opening (refer to FIG. 2) formed in the center. As is shown in FIG. 2, a gap D exists between auxiliary plate 24 and wafer W, which is set at 3 mm or under. In addition, although a notch (a V-shaped cut) is formed in a part of wafer W, it is omitted in the drawings since the notch is around 1 mm, smaller than gap D.

In addition, a circular opening is formed in a part of auxiliary plate 24, and a fiducial mark plate is embedded tightly into the opening. The surface of fiducial mark plate FM is to be co-planar with auxiliary plate 24. On the surface of fiducial mark plate FM, various kinds of fiducial marks (none of which are shown) are formed, which are used for reticle alignment (to be described later), baseline measurement by an alignment detection system ALG (also to be described later), and the like.

Figure 3:
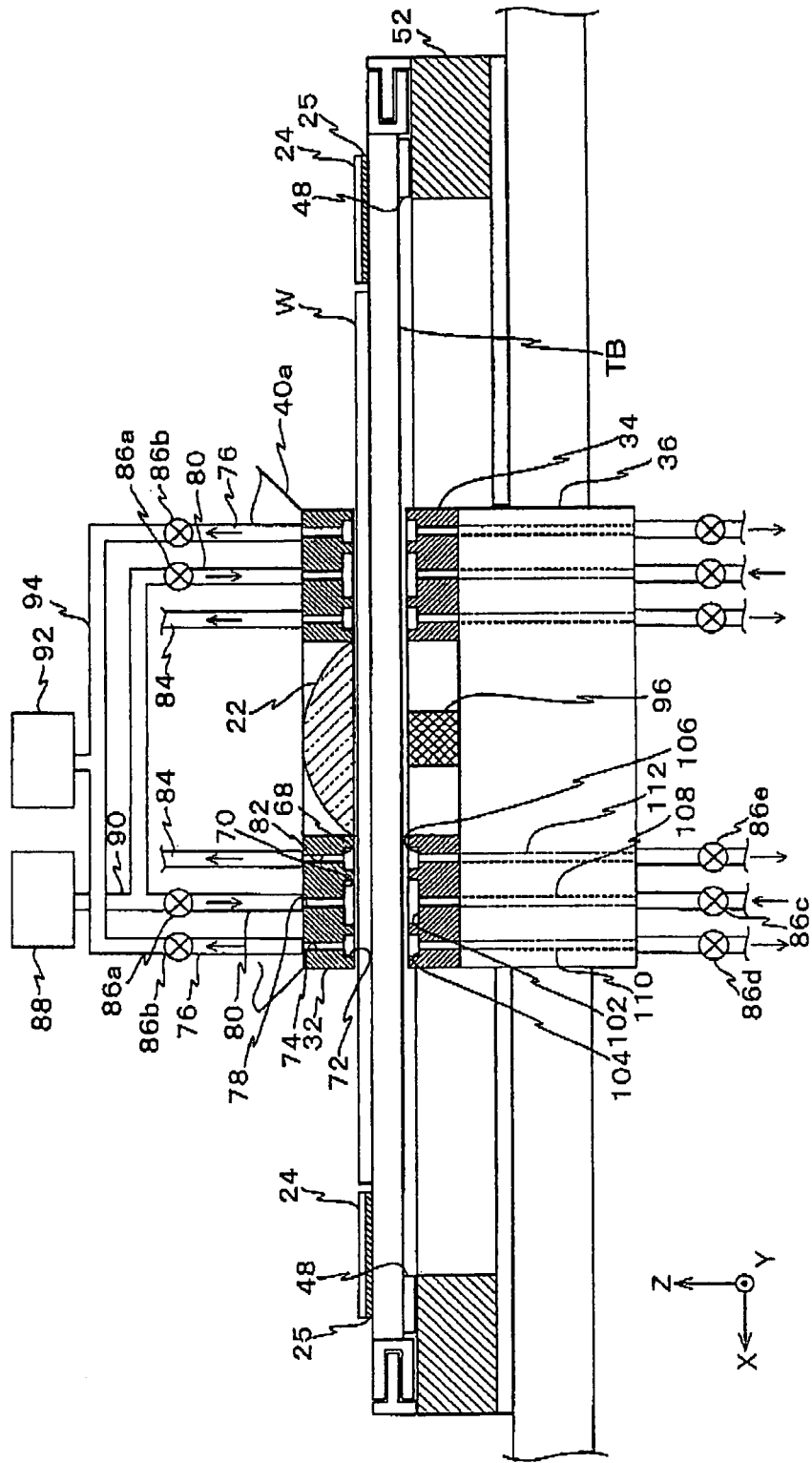
FIG. 3 is a view that schematically shows a sectional view of the drive unit in FIG. 2 in an XZ plane, with a piping system used to supply/drain liquid to hydrostatic pads.

In actual fact, as is shown in FIG. 3, an elastic body 25 is incorporated between auxiliary plate 24 and wafer table TB. In this case, when hydrostatic pad 32 is not positioned above auxiliary plate 24, the upper surface of auxiliary plate 24 is set always lower than the upper surface of wafer W. And, in a state where hydrostatic pad 32 is positioned above auxiliary plate 24, the upper surface of auxiliary plate 24 rises until it coincides with the upper surface of wafer W by the balance of positive pressure and negative pressure of hydrostatic pad 32. This allows the gap between hydrostatic pad 32 and the upper surface of auxiliary plate 24 facing hydrostatic pad 32 to be constantly maintained, therefore, the pressure can be maintained at a constant level and the amount of water leakage can be substantially reduced to zero.

Wafer table TB is configured movable not only in the scanning direction (the Y-axis direction) but also in the non-scanning direction (the X-axis direction) orthogonal to the scanning direction by the drive unit (to be described later), so that the plurality of shot areas on wafer W can be positioned to the exposure area conjugate with the illumination area referred to earlier. The arrangement allows wafer table TB to perform a step-and-scan operation in which an operation for scanning exposure of each shot area on wafer W and an operation (movement operation performed between divided areas) for moving wafer W to the acceleration starting position (scanning starting position) to expose the next shot are repeated.

In addition, as is shown in FIG. 1, on the lower surface (rear surface) of wafer table TB, a hydrostatic pad 34 serving as a fluid static bearing is arranged facing hydrostatic pad 32, and hydrostatic pad 34 is fixed on the upper surface of a fixed member 36. In this case, wafer table TB and wafer W placed on wafer table TB are held by hydrostatic pad 32 and hydrostatic pad 34 vertically in a non-contact manner. The configuration and the like of hydrostatic pad 34 and the piping system connecting to hydrostatic pad 34 will be described later in the description.

In addition, the position of wafer table TB within the XY plane (including rotation around the Z-axis (θz rotation)) is measured with an encoder 96. This point will also be described later in the description.

Next, a drive unit that drives wafer table TB will be described, referring to FIGS. 2 and 3. FIG. 2 shows a perspective view of a configuration of a drive unit 50 along with wafer table TB and the like, and FIG. 3 schematically shows the XZ section of drive unit 50, along with the piping system for supply/drainage to hydrostatic pads 32 and 34.

Drive unit 50 is equipped with a stage 52 (refer to FIG. 2) that movably supports wafer table TB from below, a first drive mechanism that drives wafer table TB in the Y-axis direction, which is the scanning direction, as well as finely drive wafer table TB in the non-scanning direction (the X-axis direction), and a second drive mechanism that drives wafer table TB integrally with stage 52 in the X-axis direction.

Stage 52 is constituted by a rectangular frame-shaped member (refer to FIG. 3). On the bottom surface of the rectangular frame-shaped member, for example, a pair of X movers 54A and 54B is arranged on both sides in the Y-axis direction, as is shown in FIG. 2. The movers are each composed of a magnetic pole unit that has a plurality of permanent magnets arranged at a predetermined spacing in the X-axis direction. And, X stators 56A and 56B, which are each composed of an armature unit and constitute X-axis linear motors 58A and 58B along with X movers 54A and 54B, respectively, are arranged each extending in the X-axis direction. X stators 56A and 56B are arranged within the same XY plane at a predetermined spacing in the Y-axis direction, and the X stators are each supported by support members (not shown). X stators 56A and 56B have a U-shaped sectional shape where movers 54A and 54B can be inserted inside, and on at least one surface that faces movers 54A and 54B, the X stators have a plurality of armature coils arranged at a predetermined spacing in the X-axis direction.

X-axis linear motors 58A and 58B that have the configuration described above drive wafer table TB in the X-axis direction integrally, with stage 52. That is, X-axis linear motors 58A and 58B constitute at least a part of the second drive mechanism.

As is shown in FIG. 3, wafer table TB is levitationally supported via a clearance of around several μm above the upper surface of stage 52, via a plurality of air bearings arranged close to the edge of the bottom surface of wafer table TB on both ends in the X-axis direction.

As is shown in FIG. 2, a pair of Y movers 60A and 60B is arranged, respectively, on the edge surface of wafer table TB on both ends in the X-axis direction at a position substantially in the center of the Y-axis direction. The movers, for example, are each composed of a magnetic pole unit that has a plurality of permanent magnets arranged at a predetermined spacing in the Y-axis direction. And, Y stators 62A and 62B, which constitute Y-axis linear motors 64A and 64B, along with Y movers 60A and 60B, respectively, are arranged on the upper surface of stage 52 on both ends of the X-axis direction, each extending in the Y-axis direction. Y stators 62A and 62B are each composed of, for example, an armature unit that has a plurality of armature coils arranged at a predetermined spacing in the Y-axis direction. Y-axis linear motors 64A and 64B drive wafer table TB in the Y-axis direction. In addition, by slightly differentiating the drive force generated by Y-axis linear motors 64A and 64B, wafer table TB can be rotated around the Z-axis.

Furthermore, on the edge surface of wafer table TB on one end (the −X end) in the X-axis direction, U-shaped permanent magnets 66A and 66B are arranged on the +Y and −Y sides of Y mover 60B. Permanent magnets 66A and 66B each constitute a voice coil motor, along with Y stator 62B. These voice coil motors finely drive wafer table TB in the X-axis direction. Hereinafter, these voice coil motors will also be referred to as voice coil motors 66A and 66B using the same reference numerals as the permanent magnets, which are the movers of the voice coil motors.

As is obvious from the description so far, Y-axis linear motors 64A and 64B and voice coil motors 66A and 66B constitute at least a part of the first drive mechanism.

Referring back to FIG. 1, alignment detection system ALG by the off-axis method is arranged on the side surface of barrel 40 of optical unit PU. As alignment detection system ALG, for example, an alignment sensor of an FIA (Field Image Alignment) system based on an image-processing method is used. The alignment sensor irradiates a broadband detection beam that does not expose the resist on the wafer on a target mark, picks up the image of the target mark formed on the photodetection surface by the reflection light from the target mark and the image of an index (not shown) using a pick-up device (such as a CCD), and outputs the imaging signals. And, based on the output of alignment detection system ALG, positional measurement of the fiducial marks on fiducial mark plate FM and alignment marks on wafer W in the X, Y two-dimensional directions can be performed.

Next, hydrostatic pads 32 and 34, and the piping connecting to the hydrostatic pads will be described, referring to FIGS. 3 and 4.

As is shown in FIG. 3, on the end (lower end section) of barrel 40 of optical unit PU on the image-plane side, a tapered section 40a is formed whose diameter becomes smaller the lower it becomes. In this case, the lens closest to the image plane (not shown) that constitutes optical system 42, or in other words, the lens second closest to the image plane that constitutes projection optical system PL, is arranged inside tapered section 40a.

As an example of hydrostatic pad 32 attached below barrel 40, a thick pad that has a annular shape (donut shape) whose outer diameter is approximately 60 mm, inner diameter is approximately 35 mm, and the height around 20 to 50 mm is used. Hydrostatic pad 32 is fixed in a state where its bearing surface (the bottom surface) is parallel to the XY plane, with the surface (the upper surface) opposite to the bearing surface fixed to the lower end surface of barrel 40. Accordingly, in the embodiment, the positional relation between hydrostatic pad 32 and projection optical system PL relative to the direction of optical axis AX of projection optical system PL is maintained constant.

Figure 4:
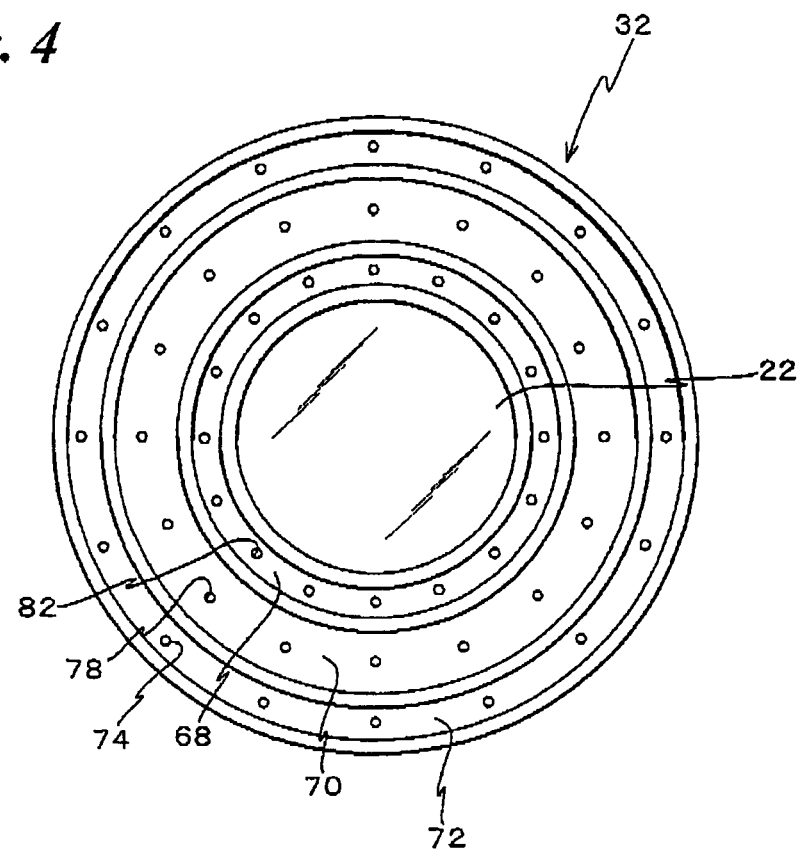
FIG. 4 is a bottom surface view of a hydrostatic pad 32.

On the bearing surface (the bottom surface) of hydrostatic pad 32, as it can be seen when viewing FIG. 3 together with FIG. 4, which is a view of the bottom surface of hydrostatic pad 32, a ring-shaped drainage groove 68 serving as a liquid drainage groove (a groove), a ring-shaped water supply groove 70 serving as a liquid supply groove (a groove), and a ring-shaped drainage groove 72 serving as a liquid drainage groove (a groove) are sequentially formed from the inside to the outside concentrically. In FIG. 3, of the three grooves 68, 70, and 72, the groove width of water supply groove 70 in the middle is around twice the width of the remaining two grooves. However, the area ratio of groove 70 and groove 72 is to be decided so that each of the positive pressure force and negative pressure force are well balanced.

On the inner bottom surface (the inner upper surface in FIG. 3) of drainage groove 72, a plurality of through holes 74 that penetrate the bottom surface in the vertical direction are formed at a substantially equal spacing. And, one end of drainage pipes 76 connects to each of the through holes 74.

Similarly, on the inner bottom surface (the inner upper surface in FIG. 3) of water supply groove 70, a plurality of through holes 78 that penetrate the bottom surface in the vertical direction are formed at a substantially equal spacing. And, one end of water supply pipes 80 connects to each of the through holes 78.

Similarly, on the inner bottom surface (the inner upper surface in FIG. 3) of drainage groove 68, a plurality of through holes 82 that penetrate the bottom surface in the vertical direction are formed at a substantially equal spacing. And, one end of drainage pipes 84 connects to each of the through holes 82.

The other end of each of the water supply pipes 80 each connect via valves 86a to the other end of a supply line 90, which has one end connecting to a liquid supply unit 88. Liquid supply unit 88 is composed including a liquid tank, a compression pump, a temperature control unit, and the like, and operates under the control of main controller 20. In this case, when liquid supply unit 88 operates when the corresponding valve 86a is open, for example, a predetermined liquid used for immersion whose temperature is controlled so that it is about the same temperature as that in a chamber (drawing omitted) where (the main body of) exposure apparatus 100 is housed is supplied into water supply groove 70 of hydrostatic pad 32, via supply line 90, water supply pipe 80, and through hole 78 in sequence. Hereinafter, valves 86a arranged in each of the water supply pipes 80 will also be considered together and referred to as valve group 86a (refer to FIG. 6).

As the liquid referred to above, in this case, ultra pure water (hereinafter, it will simply be referred to as 'water' besides the case when specifying is necessary) that transmits the ArF excimer laser beam (light with a wavelength of 193.3 nm) is to be used. Ultra pure water can be obtained in large quantities at a semiconductor manufacturing plant or the like, and it also has an advantage of having no adverse effect on the photoresist on the wafer or to the optical lenses. In addition, ultra pure water has no adverse effect on the environment and it also has an extremely low concentration of impurities, therefore, cleaning action on the surface of the wafer and the surface of SIL 22 can be anticipated.

The other end of each of the drainage pipes 76 each connect via valves 86b to the other end of a drainage line 94, which has one end connecting to a liquid recovery unit 92. Liquid recovery unit 92 is composed including a liquid tank, a vacuum pump (or a suction pump), and the like, and operates under the control of main controller 20. In this case, when the corresponding valve 86b is open, liquid recovery unit 92 recovers the water existing between the bearing surface of hydrostatic pad 32 and the surface of wafer W near drainage groove 72, via drainage pipes 76. Hereinafter, valves 86b arranged in each of the drainage pipes 76 will also be considered together and referred to as valve group 86b (refer to FIG. 6).

The other end of each of the drainage pipes 84 is drawn inside a tank (not shown). The inside of the tank is open to the atmosphere.

Similar to hydrostatic pad 32, a thick pad that has an annular shape (donut shape) whose outer diameter is approximately 60 mm, inner diameter is approximately 35 mm, and the height around 20 to 50 mm is used as hydrostatic pad 34. Hydrostatic pad 34 is fixed to the upper surface of fixed member 36 so that the bearing surface (upper surface) of hydrostatic pad 34 is parallel to the XY plane.

On the rear surface of wafer table TB, an XY two-dimensional scale (not shown) is formed, and encoder 96 that can optically (or magnetically) read the XY two-dimensional scale is disposed inside the opening formed in the center of hydrostatic pad 34. Accordingly, when a part of wafer table TB faces encoder 96, encoder 96 can measure the positional information of wafer table TB within the XY plane at a predetermined resolution, such as, for example, 0.2 nm. The measurement values of encoder 96 are supplied to main controller 20 (refer to FIG. 6). Because wafer table TB is rigidly pressed by the vertical hydrostatic pads 32 and 34, there is no flexure in the section of wafer table TB clamped by hydrostatic pads 32 and 34, which makes sign errors due to flexure of wafer table TB included in the measurement values of encoder 96 extremely small.

On the bearing surface of hydrostatic pad 34, in exactly the same arrangement and shape, a water supply groove 102 is formed serving as a liquid supply groove (a groove), as well as drainage grooves 104 and 106 serving as liquid drainage grooves (grooves) on the outside and inside of water supply groove 102. Similar to the earlier description, grooves 102, 104, and 106 have a plurality of through holes that penetrate the bottom surface of hydrostatic pad 34. And, one end of a plurality of water supply pipes 108 connects to water supply groove 102 via the plurality of through holes, respectively, while the other end of each of the water supply pipes 108 connect to a liquid supply unit 114 (not shown in FIG. 3, refer to FIG. 6) via valves 86c and water supply lines (not shown). The configuration of liquid supply unit 114 is the same as liquid supply unit 88 previously described.

One end of each of a plurality of drainage pipes 110 connects to drainage groove 104 on the outer side, via each of the plurality of through holes, whereas the other end of each of the plurality of drainage pipes 110 connects to a liquid recovery unit 116 (not shown in FIG. 3, refer to FIG. 6) via valves 86d and a recovery line (not shown). The configuration of liquid recovery unit 116 is the same as liquid recovery unit 92 previously described.

Similar to the description above, one end of each of a plurality of drainage pipes 112 connects to drainage groove 106 on the inner side, via each of the plurality of through holes, whereas the other end of each of the plurality of drainage pipes 112 connects to liquid recovery unit 116 via valves 86e and the recovery line (not shown). That is, in hydrostatic pad 34, drainage groove 106 on the inner side is not open to the atmosphere.

In the description below, valves 86c arranged on the other end of each of the plurality of water supply pipes 108 will also be considered together and referred to as valve group 86c (refer to FIG. 6). Similarly, valves 86d and 86e arranged on the other end of each of the plurality of drainage pipes 110 and 112 will also be considered together and referred to as valve groups 86d and 86e (refer to FIG. 6).

As each of the valves referred to above, adjustment valves (such as a flow control valve) or the like that open and close, and whose opening degree can also be adjusted are used. These valves operate under the control of main controller 20 (refer to FIG. 6).

Figure 6:
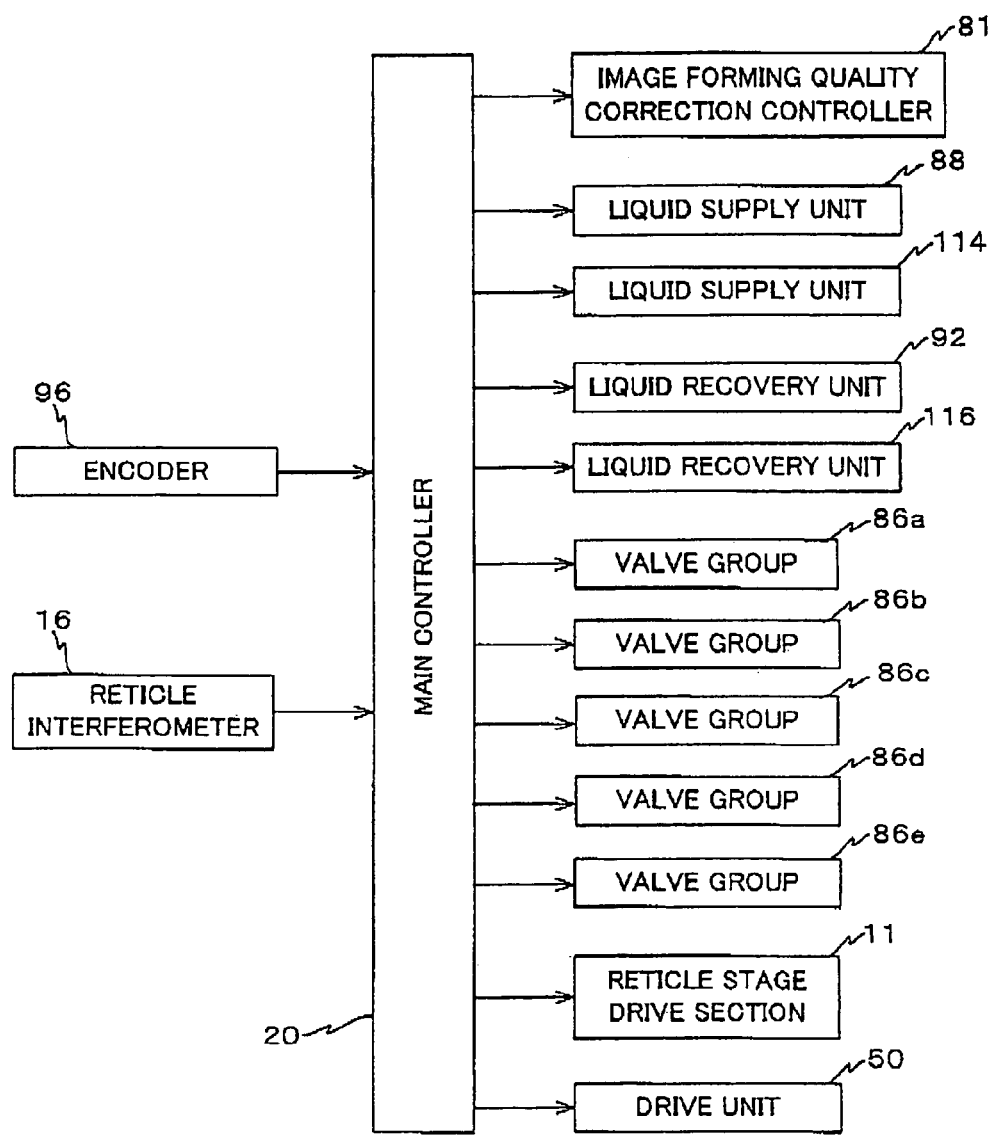
FIG. 6 is a block diagram that shows a partly omitted configuration of a control system, which is employed in the exposure apparatus in the first embodiment.

FIG. 6 is a block diagram of a configuration of a control system of exposure apparatus 100, with the configuration partially omitted. The control system is mainly composed of main controller 20, which is made up of a workstation (or a microcomputer) or the like.

Next, the support of wafer table TB by hydrostatic pads 32 and 34 in exposure apparatus 100 of the embodiment will be described with the operation of main controller 20, referring to FIGS. 3, 5, and 6, and the like.

First of all, the situation will be described where the support of wafer table. TB begins, for example, by hydrostatic pads 32 and 34, which are in a static state.

Main controller 20 firstly begins to supply water from liquid supply unit 88 to hydrostatic pad 32 on the upper side in a state where valve group 86a is opened to a predetermined degree, and also begins the operation of liquid recovery unit 92 in a state where valve group 86b is opened to a predetermined degree. This operation sends water of a predetermined pressure (positive pressure) into water supply groove 70 of hydrostatic pad 32, via supply line 90 and each of the water supply pipes 80 from liquid supply unit 88. A part of the water sent into water supply groove 70 that passes through the inside of water supply groove 70 between the bearing surface of hydrostatic pad 32 and wafer W is recovered by liquid recovery unit 92, via drainage groove 72, each of the through holes 74, drainage pipes 76, and drainage line 94 (refer to FIG. 5).

In addition, at substantially the same timing as when the water supply to hydrostatic pad 32 described above begins, main controller 20 begins to supply the water from liquid supply unit 144 to hydrostatic pad 34 on the lower side in a state where valve group 86c is opened to a predetermined degree, while beginning to operate liquid recovery unit 116 in a state where valve groups 86d and 86e are respectively opened to a predetermined degree. This operation sends water of a predetermined pressure (positive pressure) into water supply groove 102 of hydrostatic pad 34, via a supply line and each of the water supply pipes 108 from liquid supply unit 114. After the water supplied fills in the inside of water supply groove 102 of hydrostatic pad 34 and the space between the bearing surface of hydrostatic pad 34 and wafer table TB, the water is recovered by liquid recovery unit 116, via drainage grooves 104 and 106, each of the through holes, and drainage pipes 110 and 112 (refer to FIG. 5). During this operation, main controller 20 sets the degree of opening of each valve in valve groups 86d and 86e, the pressure of water supplied from liquid supply unit 114, the negative pressure that liquid recovery unit 116 generates within drainage pipes 110 and 112, and the like, so that the amount of water supplied to hydrostatic pad 34 substantially coincides with the amount of water drained from hydrostatic pad 34 via drainage grooves 104 and 106. As a result, a certain amount of water is constantly filled in the space between hydrostatic pad 34 and wafer table TB. Accordingly, the thickness of the layer of water between the bearing surface of hydrostatic pad 34 and wafer table TB is constant at all times, and wafer table TB is supported by hydrostatic pad 34 with high rigidity. In this case, the pressure of the water between hydrostatic pad 34 and wafer table TB acts as a preload (pressurization force) to hydrostatic pad 32 on the upper side. That is, wafer table TB is always pressed from below at a constant force.

In this case, main controller 20 sets the degree of opening of each valve in valve groups 86a and 86b, the pressure of the water supplied from liquid supply unit 88, the negative pressure that liquid recovery unit 92 generates within each of the drainage pipes 76, and the like, so that the amount of water supplied to hydrostatic pad 32 is slightly larger than the amount of water drained from drainage groove 72. Therefore, the remaining water that is supplied to hydrostatic pad 32 but is not drained from drainage groove 72 is drained outside via each of the through holes 82 and drainage pipes 84 formed in drainage groove 68, after the water fills in the space (including the space below SIL 22) between the bearing surface of hydrostatic pad 32 and wafer table TB.

Because drainage groove 68 is a passive drainage groove open to the atmosphere, the water existing in the space between SIL 22 and wafer W is in a state open to the atmosphere. Accordingly, there is almost no hydrostatic on SIL 22, which makes a stress free state.

Meanwhile, the water near the inside of water supply groove 70 is under high pressure (positive pressure), which gives a high load capacity and rigidity to hydrostatic pad 32. In addition, the space between hydrostatic pad 32 and the surface of wafer W is constantly filled with a certain amount of water, and liquid recovery unit 93 constantly recovers a part of the water filled by a certain amount. As a result, the gap (the so-called bearing gap) between the bearing surface of hydrostatic pad 32 and the surface of wafer W is constantly maintained.

Accordingly, in the embodiment, the area of wafer table TB and wafer W mounted on wafer table TB in the vicinity of SIL 22 is supported with high rigidity, in a state vertically clamped by hydrostatic pads 32 and 34.

Figure 5:
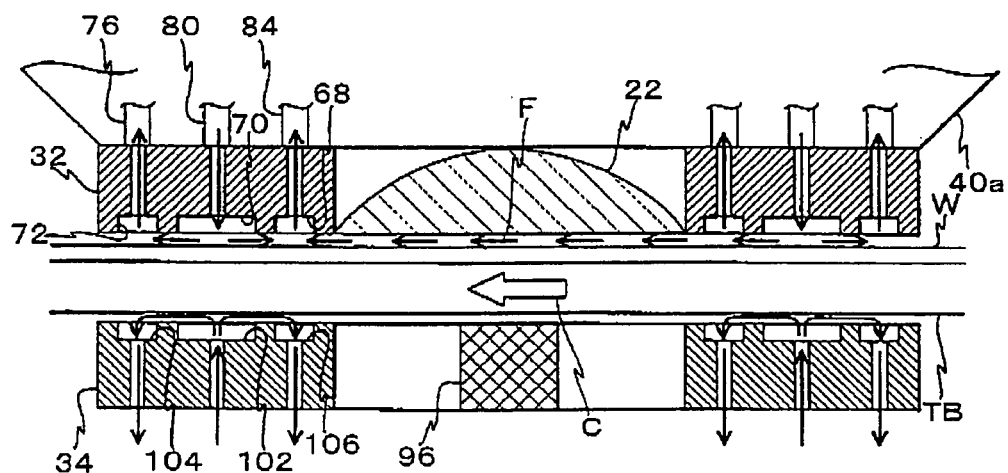
FIG. 5 is a view that shows a flow of water around hydrostatic pads 32 and 34, in the case the hydrostatic pads support a wafer table.

And, when wafer table TB moves in a predetermined direction, like the direction in FIG. 5 indicated by arrow C, a water flow indicated by arrow F in FIG. 5 is generated below SIL 22. The water flow indicated by arrow F is a laminar Couette flow that is generated when shear force due to relative displacement of the surface of wafer W and the lower surface of SIL 22 is applied to the water, which is an incompressible viscous fluid as well as a Newtonian fluid that obeys Newton's law of viscosity.

In exposure apparatus 100 of the embodiment, when wafer table TB and wafer W are driven while being clamped by hydrostatic pads 32 and 34 in the manner described above as in, for example, the stepping operation in between shots of wafer table TB (to be described later) and the scanning exposure operation, a viscous Couette flow corresponding to the drive direction occurs, which makes the water under SIL 22 replace.

In exposure apparatus 100 of the embodiment that has the configuration described above, in the same manner as in a typical scanning stepper, predetermined preparatory operations are performed such as reticle alignment that uses a reticle alignment system (not shown), alignment detection system ALG, and fiducial mark plate FM earlier described, and wafer alignment as in baseline measurement of alignment detection system ALG, and wafer alignment by EGA (Enhanced Global Alignment), and the like. Details on preparatory operations such as reticle alignment, baseline measurement, and the like described above are disclosed in, for example, Kokai (Japanese Unexamined Patent Publication) No. 7-176468 and the corresponding U.S. Pat. No. 5,646,413, and details on the following operation, EGA, are disclosed in, for example, Kokai (Japanese Unexamined Patent Publication) No. 61-44429 and the corresponding U.S. Pat. No. 4,780,617. As long as the national laws in designated states (or elected states), to which this international application is applied, permit, the above disclosures of each of the publications and the corresponding U.S. patents are incorporated herein by reference.

Then, when wafer alignment is completed, main controller 20 begins the water supply operation described earlier to hydrostatic pads 32 and 34, and then as is described earlier, wafer table TB and wafer W mounted on wafer table TB are clamped by hydrostatic pads 32 and 34 with high rigidity.

Next, based on the wafer alignment results, main controller 20 moves wafer table TB to the acceleration starting position for exposing the first shot area (first shot) serving as a first divided area on wafer W, via drive unit 50.

When wafer W has been moved to the acceleration starting position described above, main controller 20 begins relative scanning of reticle stage RST and wafer table TB in the Y-axis direction, via reticle stage drive section 11 and the first drive mechanism (Y-axis linear motors 64A and 64B, and voice coil motors 66A and 66B) of drive unit 50. Then, when reticle stage RST and wafer table TB each reach their target scanning speed and move into a constant speed synchronous state, illumination light (ultraviolet pulse light) IL from illumination system 10 begins to illuminate the pattern area of reticle R, and scanning exposure begins. The relative scanning described above is performed by main controller 20, which controls reticle stage drive section 11 and the first drive mechanism while monitoring the measurement values of encoder 96 and reticle interferometer 16 previously described.

Especially during the scanning exposure described above, main controller 20 synchronously controls reticle stage RST and wafer table TB so that movement speed Vr of reticle stage RST in the Y-axis direction and movement speed Vw of wafer table TB in the Y-axis direction are maintained at a speed ratio corresponding to the projection magnification of projection optical system PL.

Then, different areas in the pattern area of reticle R are sequentially illuminated by illumination light IL, and when the entire pattern area has been illuminated, scanning exposure of the first shot is completed. By this operation, the pattern of reticle R is reduced and transferred onto the first shot via projection optical system PL.

When scanning exposure of the first shot on wafer W is completed in this manner, main controller 20 steps wafer table TB via the second drive mechanism (X-axis linear motors 58A and 58B) of drive unit 50, for example, in the X-axis direction, to the acceleration starting position for exposing the second shot (the shot area serving as a second divided area) on wafer W. Next, scanning exposure of the second shot on wafer W is performed in the manner similar to the description above, under the control of main controller 20.

In this manner, scanning exposure of the shot area on wafer W and the stepping operation between shot areas are repeatedly performed, and the circuit pattern of reticle R is sequentially transferred onto the shot areas of wafer W serving as a plurality of divided areas.

On the stepping operation between shot areas of wafer table TB and on the scanning exposure operation described above, because the viscous Couette flow described above is generated in the direction corresponding to the drive direction of wafer table TB, the water below SIL 22 is constantly replaced. Accordingly, in exposure apparatus 100, immersion exposure is performed constantly using water fresh and stable in temperature.

In addition, for example, in the case the periphery shot areas on wafer W are exposed, the case may occur when at least a part of the bearing surface of hydrostatic pad 32 moves away from wafer W, however on wafer table TB, since auxiliary plate 24 previously described is arranged in the periphery of wafer W, the state where the entire bearing surface of hydrostatic pad 32 faces either wafer W or the auxiliary plate can be maintained. In this case, when hydrostatic pad 32 is positioned above auxiliary plate 24 as is earlier described, the upper surface of auxiliary plate 32 rises to coincide with the upper surface of wafer W due to the balance of positive pressure and negative pressure of hydrostatic pad 32. Accordingly, the water supplied to hydrostatic pad 32 can be held by hydrostatic pad 32 and by auxiliary plate 24 or wafer W, and leakage of the water can be prevented.

As is obvious from the description so far, in the embodiment, hydrostatic pad 32, liquid supply unit 88, liquid recovery unit, 92, and the water supply/drainage system (to be more specific, drainage pipes 76, water supply pipes 80, drainage pipes 84, valve groups 86a and 86b, supply line 90, and drainage line 94) connecting to the parts above constitute a liquid bearing unit.

As is described in detail above, according to exposure apparatus 100 of the embodiment, the hydrostatic bearing unit described above maintains the distance between the bearing surface of hydrostatic pad 32 and the surface of wafer W mounted on wafer table TB in the direction of optical axis AX (the Z-axis direction) of projection optical system PL at a predetermined amount (e.g., around 10 μm). Further, on the rear surface side of wafer table TB, hydrostatic pad 34 serving as a fluid static bearing is arranged facing hydrostatic pad 32. And, by hydrostatic pad 34, the water is supplied to the space between the bearing surface that faces the rear surface of wafer table TB and the wafer table; and by the static pressure of the water, the gap between the bearing surface and the wafer table is maintained. As a result, wafer table TB and wafer W mounted on wafer table TB are clamped with hydrostatic pads 32 and 34, vertically. In this case, the distance between each of the bearing surfaces of hydrostatic pads 32 and 34 and wafer W or wafer table TB can be maintained stably and constantly at, for example, around 10 μm or under. Different from static gas bearings, since hydrostatic bearings such as the hydrostatic pads utilize the static pressure of the water (liquid), which is an incompressible fluid, between the bearing surface and the support object (wafer W or wafer table TB), the rigidity of the bearings is high and the distance between the bearing surface and the support object can be maintained stably and constantly. In addition, when compared to gas (e.g., air), water (liquid) is higher in viscosity and liquid is superior in vibration damping than gas. As a result, the position of wafer table TB and wafer W in the Z-axis direction (the direction of optical axis AX) does not shift in at least the exposure area and the neighboring area, while wafer table TB and wafer W are being moved.

Therefore, according to exposure apparatus 100 of the embodiment, the pattern of reticle R can be transferred onto the plurality of shot areas on wafer W in a state where defocus caused by the movement of wafer table TB is substantially prevented for certain, without necessarily having to arrange a focal position detection system such as a focus sensor.

In addition, in exposure apparatus 100 of the embodiment, because wafer table TB and wafer W are clamped with high rigidity by hydrostatic pads 32 and 34 in the strip-shaped area (the area corresponding to the bearing surfaces of hydrostatic pads 32 and 34) around SIL 22 that includes the projection area (exposure area) of the pattern on wafer W, the rigidity of wafer table TB itself does not have to be so high. As a result, the thickness of wafer table TB can be reduced, which reduces the weight of wafer table TB and allows the position controllability to be improved. For example, the thickness of wafer table TB can be reduced to around a quarter or under the conventional tables. That is, the thickness of wafer table TB can be set to around 10 mm or under.

In addition, in exposure apparatus 100 of the embodiment, wafer W is exposed by illumination light IL in a state where water (high refractive index fluid) that has a higher refractive index than air constantly exists in the space between the lower surface of SIL 22 being the optical member of projection optical system PL closest to the image plane and the surface of wafer W, via the pattern area of reticle R, projection optical system PL, and the water. That is, immersion exposure is performed, which shortens the wavelength of illumination light IL on the surface of wafer W to $1/n^{th}$ of the wavelength in the air (n is the refractive index of liquid, in the case of water, n is 1.4), which in turn widens the effective depth of focus n times compared to the depth of focus in the air. Accordingly, exposure can be performed with high resolution. In the case the depth of focus that has to be secured is about the same as when exposure is performed in the air, the numerical aperture (NA) of projection optical system PL can be increased, which can also improve the resolution.

In addition, when the effective depth of focus widens n times compared to the depth of focus in the air, it also has the effect of being able to suppress defocus.

In addition, in exposure apparatus 100 of the embodiment, because the water supplied to hydrostatic pad 32 is constantly replaced as is previously described during scanning exposure or the like, the water flow removes foreign objects that adhere to wafer W.

In addition, according to exposure apparatus 100 of the embodiment, even when wafer table TB moves to a position where projection optical system PL is away from wafer W in a state where the water is held in the space between projection optical system PL and wafer W, such as when exposing shot areas in the periphery of wafer W or when exchanging the substrate on wafer table TB after exposure has been completed, the water can be held in the space between projection optical system PL and auxiliary plate 24 and water leakage can be prevented. Accordingly, various inconveniences that occur due to water leakage can be prevented. Further, because the gap between auxiliary plate 24 and wafer W is set to 3 mm or under, the liquid is kept from flowing out into the gap between wafer W and auxiliary plate 24 due to the surface tension of the liquid, while wafer table TB moves from the state where wafer W is below projection optical system PL to a position where wafer W is away from projection optical system PL.

Therefore, according to exposure apparatus 100 of the present invention, due to the various effects described above, the pattern of reticle R can be transferred onto each of the plurality of shot areas on wafer W with extremely good precision. In addition, exposure can be performed with a wider depth of focus than the depth of focus in the air.

In addition, in exposure apparatus 100 of the embodiment, because the lower surface of SIL 22 being the optical member of projection optical system PL closest to the image plane substantially coincides with the bearing surface of hydrostatic pad 32, the distance between SIL 22 and the surface of wafer W is around 10 μm, which is the distance between hydrostatic pad 32 and wafer W. Accordingly, the amount of liquid supplied for immersion exposure can be reduced and the water can also be recovered smoothly after the immersion exposure, which allows wafer W to dry easily after the water recovery.

In addition, because the thickness of the layer of water is extremely thin, absorption of illumination light IL by the water is small. Furthermore, optical aberration caused by the uneven water temperature can be suppressed.

In the embodiment above, the case has been described where wafer table TB and wafer W are clamped vertically with high rigidity by hydrostatic pads 32 and 34. However, since the purpose of hydrostatic pad 34 in particular, which is arranged below wafer table TB, is mainly to provide a constant preload (pressurization) to hydrostatic pad 32 on the upper side, hydrostatic pad 34 does not necessarily have to be arranged as long as a constant upward force can be provided to the rear surface of wafer table TB. Or, instead of hydrostatic pad 34, other types of fluid bearings can also be used, such as for example, vacuum preload air bearings or the like that has high bearing rigidity among static gas bearings that utilize static pressure of pressurized gas.

In addition, in the embodiment above, the case has been described where a part of the water supplied to hydrostatic pad 32 is used for immersion exposure. The present invention, however, is not limited to this, and the liquid for immersion exposure may also be supplied to the space between projection optical system PL and wafer W via a supply path completely independent from the supply path that supplies the water to hydrostatic pad 32.

Furthermore, in the embodiment above, the case has been described where the present invention is applied to an exposure apparatus that performs immersion exposure. However, the method of supporting a moving body such as wafer table TB using hydrostatic bearings as in hydrostatic pads can also be suitably applied to an exposure apparatus that does not perform immersion exposure. Even in such a case, hydrostatic bearings maintain the distance between the bearing surface and the surface of the substrate (wafer) in the optical axis direction at a predetermined amount (e.g., around 10 μm). Different from static gas bearings, since hydrostatic bearings utilize static pressure of the liquid, which is an incompressible fluid, between the bearing surface and the support object (substrate), the rigidity of the bearings is high, which allows the distance between the bearing surface and the substrate to be stably and constantly maintained. Further, liquid (such as pure water) is higher in viscosity than gas (such as air), and is also superior in vibration damping than gas. Therefore, according to the exposure apparatus of the present invention, pattern transfer onto a substrate almost free from defocus can be achieved, without necessarily having to arrange a focal position detection system.

In the embodiment above, the case has been described where donut-shaped hydrostatic pad 32 is arranged on the upper side (the image plane side of projection optical system PL) of wafer W on wafer table TB and hydrostatic pad 34 is arranged on the lower side of wafer table TB. The present invention, however, is not limited to this, and a hydrostatic bearing that has a rectangular annular bearing surface surrounding the exposure area (the projection area of the reticle pattern) may be arranged, instead of at least one of hydrostatic pad 32 and/or hydrostatic 34 described above.

In addition, instead of hydrostatic pad 32, a plurality of small hydrostatic pads can be attached near the lower end of projection optical system PL, surrounding the exposure area (the projection area of the reticle pattern). Similarly, instead of hydrostatic pad 34, a plurality of small fluid static bearings may be arranged facing the rear surface of wafer table TB, in area that corresponds to the area surrounding the exposure area (the projection area of the reticle pattern). Or, one, two or more hydrostatic pads arranged instead of hydrostatic pad 32 may be arranged on the side of the image plane of projection optical system PL, while the positional relation between projection optical system PL is maintained.

In the embodiment above a focal position detection system (focus sensor) is not provided in particular. In the case a focus sensor is necessary, however, a gap sensor, which measures the spacing between hydrostatic pad 32 and the surface of wafer W at one or more measurement point may be arranged on hydrostatic pad 32, and based on the measurement values of the gap sensor, the liquid recovery unit (or main controller 20) can adjust the negative pressure generated inside drainage pipes 76 connecting to hydrostatic pad 32 so as to adjust the position (focus) of the surface of wafer W in the Z-axis direction. In this case, as the gap sensor, a pressure sensor can be used that measures the difference between the hydrostatic acting on a diaphragm arranged on a part of hydrostatic pad 32 and the atmospheric pressure, and converts the difference into distance. Or, a capacitive sensor can also be used. Further, for example, a detection beam can be irradiated on wafer W via an optical element, which is at least a part of projection optical system PL, for measuring the spacing between projection optical system PL and wafer W by receiving the reflection beam, and the spacing between hydrostatic pad 32 and the surface of wafer W can be adjusted according to the measurement values.

In the embodiment above, the case has been described where an optical (or a magnetic) encoder 96 reads the XY two-dimensional scale formed on the rear surface of wafer table TB in order to measure the position of wafer table TB within the XY plane. The present invention, however, is not limited to this, and a laser interferometer may be used to measure the positional information of wafer table TB within the XY plane.

Figure 7:
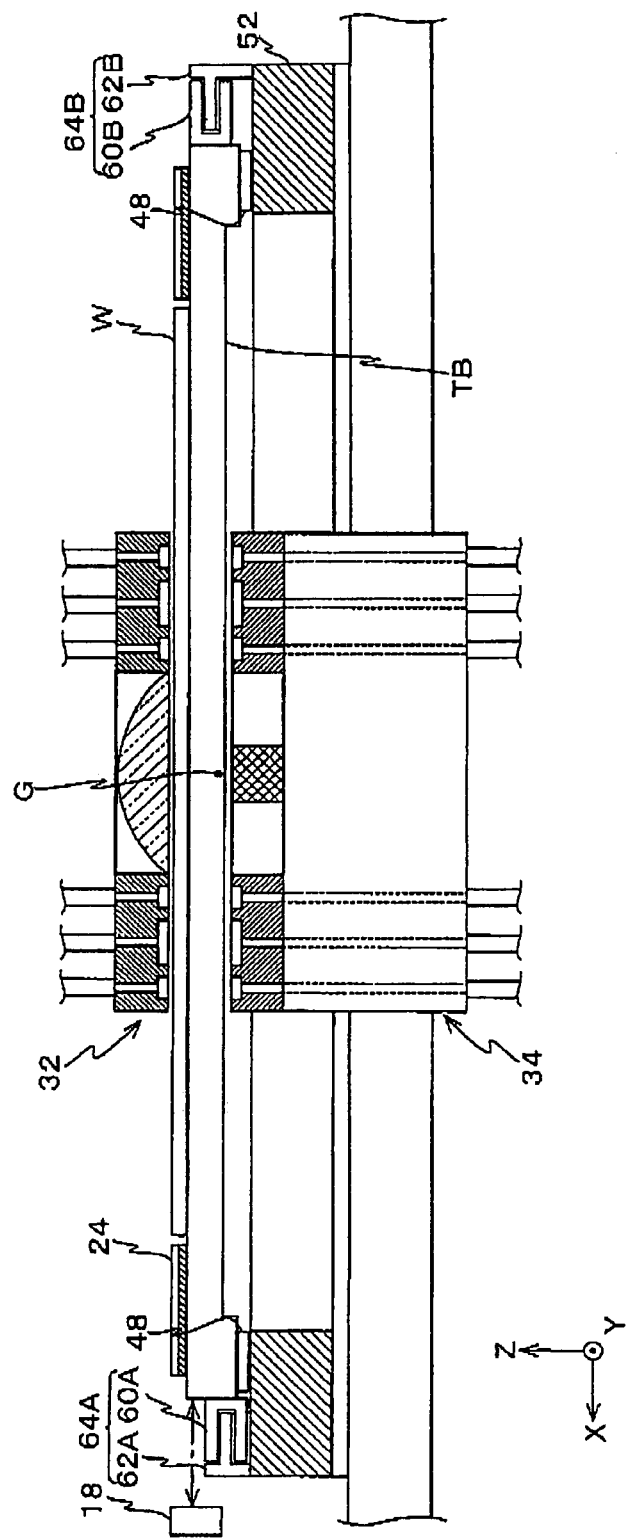
FIG. 7 is a view that shows a configuration of a wafer table in the case an interferometer is used as a position detection system.

In this case, the edge surface (e.g., the edge surface on the +X side) of wafer table TB on one end of the X-axis direction and the edge surface (e.g., the edge surface on the −Y side) of wafer table TB on one end of the Y-axis direction have to be mirror polished. However, as it can be seen in FIG. 2, Y mover 60A of Y-axis linear motor 64A is arranged on the edge surface on the +X side, therefore, in such a state, the edge surface on the +X side might not be able to be mirror polished entirely in the Y-axis direction. In this case, by shifting the position of both Y movers 60A and 60B in the Z-axis direction as is shown in FIG. 7, the edge surface of wafer table TB on the +X side can be mirror polished entirely in the Y-axis direction. By arranging Y movers 60A and 60B at a point symmetry position with respect to center of gravity G of wafer table TB, the thrust of Y-axis linear motors 64A and 64B can be made to act on center of gravity G of wafer table TB.

On the reflection surface made in the manner described above, measurement beams from an interferometer 18 (FIG. 7 shows the interferometer used only for measurement in the X-axis direction) is irradiated, and when interferometer 18 receives the reflection beams, interferometer 18 measures the position of wafer table TB in the X-axis direction and the Y-axis direction at a resolution, for example, around 0.5 to 1 nm. In this case, as the interferometer, a multi-axis interferometer that has a plurality of measurement axes can be used, and with this interferometer, other than the X, Y positions of wafer table TB, rotation (yawing (θz rotation, which is rotation around the Z-axis), rolling (θy rotation, which is rotation around the Y-axis, and pitching (θx rotation, which is rotation around the X-axis)) can also be measured.

MODIFIED EXAMPLE

Figure 8:
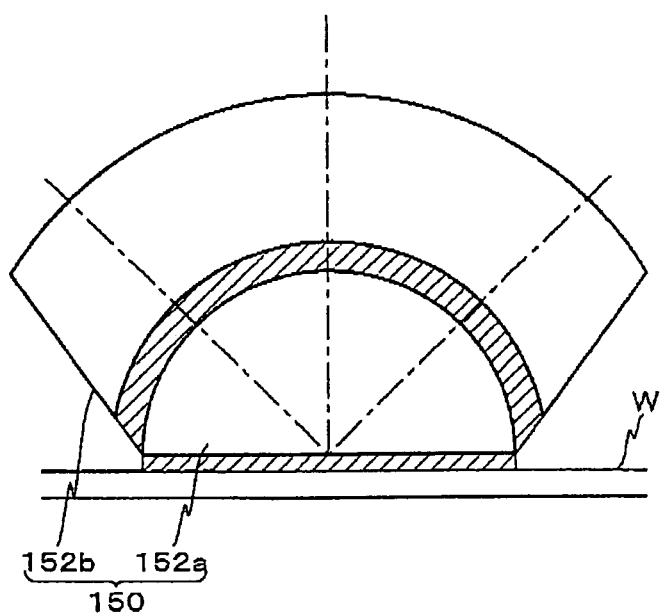
FIG. 8 is a view used to describe a modified example.

In the description so far, the case has been described where hydrostatic pad 32 is fixed to barrel 40 and the position relation between projection optical system PL and hydrostatic pad 32 is constantly maintained. The present invention, however, is not limited to this, and for example, as the optical element that constitutes projection optical system PL closest to the image plane, a divided lens, which is vertically divided into two, as is shown in FIG. 8, may be used. Divided lens 150 in FIG. 8 is composed of a first segment lens 152a of a hemispheric shape arranged on the lower side, and a second segment lens 152b. Second segment lens 152b has an inside (inner surface), which is a spherical surface whose radius of curvature has the same center point as the outer surface (a part of the spherical surface) of the first segment lens 152a but is slightly larger than the radius of curvature of the first segment lens 152a, and an outside (outer surface), which is a spherical surface whose center is a point different from the center of the first segment lens 152a. In this case, the first segment lens 152a is a plane-convex lens and the second segment lens 152b is a concave meniscus lens.

Divided lens 150 configured in the manner described above can be used instead of SIL 22 in the embodiment above. In this case, the second segment lens 152b is integrally attached to barrel 40, and the first segment lens 152a is to be held by hydrostatic pad 32 so that the bearing surface of hydrostatic pad 32 and the lower surface of the first segment lens 152a becomes substantially co-planar with each other. Then, the liquid (such as water) for immersion is to be filled in the space not only under the first segment lens 152a (the space between the first segment lens 152a and wafer W), but also in the gap between the first segment lens 152a and the second segment lens 152b. When such a configuration is employed, in the case the first segment lens 152a is pressurized too much by the hydrostatic acting on the first segment lens 152a, the first segment lens 152a moves vertically with hydrostatic pad 32, which can suppress unnecessary stress being generated in the first segment lens 152a, which in turn can prevent the optical performance from deteriorating. In this case, the vertical movement of the first segment lens 152a and hydrostatic pad 32 sets the pressure (positive pressure) within the water supply groove and the pressure (negative pressure) within the drainage groove at an even balance, which makes the thickness of the water layer (water film) under the first segment lens 152a constant, and by the vertical movement of the first segment lens 152a, the optical path changes, which makes it possible to automatically adjust the focus position.

In the embodiment, divided lens 150 is divided into a plane-convex lens and a concave meniscus lens. However, the optical element on the upper side close to the pupil plane of projection optical system PL can be a plane-convex lens and the optical element on the lower side close to the image plane of projection optical system PL can be a non-refractive power parallel plane plate. In this case, when the image forming characteristics such as the image plane of the projection optical system PL change by the shift of the parallel plane plate, at least one of moving a part of the lens of the projection optical system, moving the reticle, or finely adjusting the wavelength of the exposure light can be performed, in order to compensate for the changes in the image forming characteristics.

In the first embodiment above, the case has been described where the present invention has been applied to an exposure apparatus equipped with one wafer table TB and one stage 52 that supports the wafer table. The present invention, however, is not limited to this, and the present invention may also be suitably applied to an exposure apparatus that has a plurality (e.g., two) of wafer tables TB and stages, as in the following second embodiment.

Second Embodiment

Figure 9:
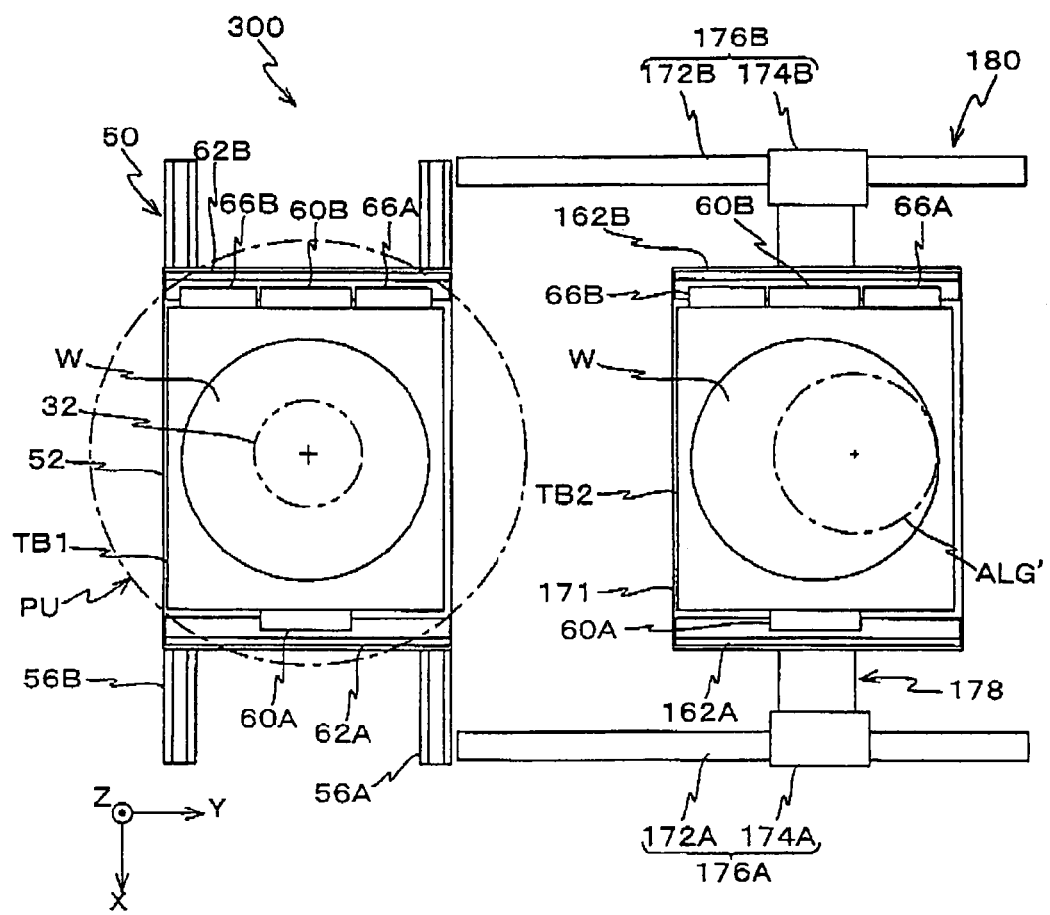
FIG. 9 is a planar view that shows a configuration related to a wafer stage unit, which constitutes an exposure apparatus in a second embodiment.

Next, an exposure apparatus of a second embodiment of the present invention is described, referring to FIGS. 9 and 10. FIG. 9 is a planar view showing a configuration of a wafer stage unit 300 that constitutes the exposure apparatus of the second embodiment. From the viewpoint of preventing redundant explanations, the same reference numerals will be used for parts that have the same or similar arrangement as the first embodiment previously described, and the description thereabout will be omitted.

In the exposure apparatus of the second embodiment, optical unit PU, and an alignment detection system ALG' similar to alignment detection system ALG is disposed in the Y-axis direction spaced apart at a predetermined distance. And, below optical unit PU, drive unit 50 described earlier is disposed, and wafer W is to be mounted on a wafer table TB1 provided on stage 52, which constitutes drive unit 50. In addition, below an alignment detection system ALG', an XY stage unit 180 is disposed. A wafer table TB2 is provided on a stage 171 that constitutes XY stage unit 180, and wafer W is to be mounted on wafer table TB2.

XY stage unit 180 is equipped with stage 171 constituted by a rectangular member, which has the same shape as the outer shape of stage 52 previously described, an X-axis linear motor 178 that drives stage 171 in the X-axis direction, and a pair of Y-axis linear motors 176A and 176B that drive stage 171 in the Y-axis direction integrally with X-axis linear motor 178.

Y-axis linear motors 176A and 176B are constituted by Y stators (Y-axis linear guides) 172A and 172B that are arranged in the X-axis direction near both ends of X stator 56A, which constitutes drive unit 50, respectively extending in the Y-axis direction, and Y movers (sliders) 174A and 174B that separately engage with Y stators 172A and 172B, respectively. That is, with one of the Y stators, 172A, and one of the Y movers, 174A, Y linear motor 176A is configured that generates a drive force that drives Y mover 174A in the Y-axis direction by the electromagnetic interaction of Y stator 172A and Y mover 174A, whereas, with the other Y stator, 172B, and the other Y mover, 174B, Y linear motor 176B is configured that generates a drive force that drives Y mover 174B in the Y-axis direction by the electromagnetic interaction of Y stator 172B and Y mover 174B.

Y movers 174A and 174B are respectively fixed to both ends of the X stator (X-axis linear guide) extending in the X-axis direction that constitutes X linear motor 178 described above. And, on stage 171, an X mover is arranged corresponding to the X stator of X linear motor 178, and by X linear motor 178 constituted by the X mover and the X stator 178, stage 171 is driven in the X-axis direction.

In this case, stage 171 is driven in the X-axis direction by X linear motor 178, and stage 171 is also driven in the Y-axis direction integrally with X linear motor 178 by the pair of Y linear motors 176A and 176B.

On the upper surface of stage 171 on both ends in the X-axis direction, Y stators 162A and 162B are arranged, respectively, extending in the Y-axis direction.

Wafer tables TB1 and TB2 both have exactly the same configuration as wafer table TB previously described, and similarly, wafer tables TB1 and TB2 each have Y mover 60A arranged on one end in the X-axis direction, and permanent magnets 66A and 66B and Y mover 60B arranged on the other end in the X-axis direction.

According to wafer stage unit 300 in FIG. 9, Y mover 60A arranged in wafer table TB1 not only generates a drive force in the Y-axis direction by electromagnetic interaction with Y stator 62A in a state (the state in FIG. 9) where Y mover 60A is engaged with Y stator 62A on stage 52, but also in a state where Y mover 60A is engaged with Y stator 162A on stage 171, Y mover 60A generates a drive force in the Y-axis direction by electromagnetic interaction with Y stator 162A.

Similarly, Y mover 60A arranged in wafer table TB2 not only generates a drive force in the Y-axis direction by electromagnetic interaction with Y stator 162A in a state (the state in FIG. 9) where Y mover 60A is engaged with Y stator 162A on stage 171, but also in a state where Y mover 60A is engaged with Y stator 62A on stage 52, Y mover 60A generates a drive force in the Y-axis direction by electromagnetic interaction with Y stator 62A.

Similarly, Y mover 60B arranged in wafer table TB1 not only generates a drive force in the Y-axis direction by electromagnetic interaction with Y stator 62B in a state (the state in FIG. 9) where Y mover 60B is engaged with Y stator 62B on stage 52, but also in a state where Y mover 60B is engaged with Y stator 162B on stage 171, Y mover 6013 generates a drive force in the Y-axis direction by electromagnetic interaction with Y stator 162B.

Similarly, Y mover 60B arranged in wafer table TB2 not only generates a drive force in the Y-axis direction by electromagnetic interaction with Y stator 162B in a state (the state in FIG. 9) where Y mover 60B is engaged with Y stator 162B on stage 171, but also in a state where Y mover 60B is engaged with Y stator 62B on stage 52, Y mover 60B generates a drive force in the Y-axis direction by electromagnetic interaction with Y stator 62B.

In addition, permanent magnets 66A and 66B arranged in wafer table TB1 each constitute a voice coil motor that finely moves wafer table TB1 on stage 52 in the X-axis direction in a state (the state in FIG. 9) where permanent magnets 66A and 66B are each engaged with Y stator 62B, as well as constitute a voice coil motor that finely moves wafer table TB1 on stage 171 in the X-axis direction in a state where permanent magnets 66A and 66B are each engaged with Y stator 162B. Similarly, permanent magnets 66A and 66B arranged in wafer table TB2 each constitute a voice coil motor that finely moves wafer table TB2 on stage 171 in the X-axis direction in a state (the state in FIG. 9) where permanent magnets 66A and 66B are each engaged with Y stator 162B, as well as constitute a voice coil motor that finely moves wafer table TB2 on stage 52 in the X-axis direction in a state where permanent magnets 66A and 66B are each engaged with Y stator 62B.

The position of wafer tables TB1 and TB2 within the XY plane is measured with a laser interferometer or other position measuring units (not shown), and the measurement results are sent to a main controller (not shown). In addition, each motor previously described that constitutes wafer stage unit 300 operates under the control of the main controller.

The configuration of other parts is the same as the configuration in exposure apparatus 100 of the first embodiment previously described.

In the exposure apparatus of the second embodiment configured in the manner described above, the following processing sequence can be performed under the control of the main controller.

More specifically, for example, wafer table TB2 (or TB1) that holds wafer W is provided on one of the stages, stage 171. And, in parallel with detection operation (such as wafer alignment measurement operation by the EGA method) of alignment marks formed on wafer W mounted on wafer table TB2 (or TB1), which is performed below alignment detection system ALG' while wafer table TB2 (or TB1) is being driven two dimensionally, exposure operation of wafer W held on wafer table TB1 (or TB2) provided on the other stage is also performed by drive unit 50 in the step-and-scan method described earlier, while wafer table TB1 (or TB2) is being driven.

Then, after the parallel operation has been completed, stage 171 is moved to a position closest to stage 52 using Y-axis linear motors 176A and 176B, and the positional relation of both stages 171 and 52 in the X-axis direction is also adjusted so that the position of both stages 171 and 52 in the X-axis direction coincides with each other.

Next, wafer table TB1 (or TB2) holding wafer W that has already been exposed is driven in the −Y direction by the electromagnetic interaction between Y movers 60A and 60B and Y stators 62A and 62B arranged in the wafer table. At the same time, wafer table TB2 (or TB1) holding wafer W on which mark detection operation has already been completed is also driven in the −Y direction at the same speed as the other stage by the electromagnetic interaction between Y movers 60A and 60B and Y stators 162A and 162B arranged in the wafer table. Accordingly, both wafer tables TB1 and TB2 move in the −Y direction while maintaining the positional relation closest to each other.

Then, when a predetermined amount of time passes after wafer tables TB1 and TB2 begin to move in the −Y direction as is described above, Y movers 60A and 60B arranged in wafer table TB2 (or TB1) holding wafer W on which mark detection operation has already been completed, move into a state where movers 60A and 603 become engaged simultaneously with Y stators 162A and 162B and Y stators 62A and 62B. This state is shown in FIG. 10.

Then, when wafer tables TB1 and TB2 move from the state in FIG. 10 further in the −Y direction by a predetermined distance, Y movers 60A and 60B arranged in wafer table TB1 (or TB2) holding wafer W that has already been exposed reach a position (detaching position) where Y movers 60A and 60B become completely detached from Y stators 62A and 62B. And, just before wafer table TB1 (or TB2) reaches the detaching position described above, a robot arm (not shown) receives wafer table TB1 (or TB2), and carries wafer table TB1 (or TB2) to a wafer exchange position near alignment detection system ALG'.

At this point, wafer table TB2 (or TB1) holding wafer W on which mark detection operation has already been completed has reached the position under hydrostatic pad 32 arranged on the lower end of optical unit PU. And then, wafer table TB2 (or TB1) moves to a position where its entire body is mounted on stage 52, which completes the wafer table exchange operation on stage 52.

As is described above, in the second embodiment, movement of the wafer table holding wafer W that has already been exposed in the −Y direction on stage 52 and the delivery of the wafer table to the robot arm, and the movement of the wafer table holding wafer W on which mark detection operation has already been completed from stage 171 to stage 52 are performed in parallel. As a consequence, one of the wafer tables is located constantly under hydrostatic pad 32 directly below projection optical system PL, that is, below the optical member (SIL 22 or the first segment lens 152a described earlier) closest to the image plane of the optical members constituting projection optical system PL, and the state where an immersion area is formed between the wafer table and the wafer on the wafer table or auxiliary plate 24 is maintained, which allows the liquid (water) to be held between projection optical system PL, or in other words, the optical member closest to the image plane constituting projection optical system PL, and the wafer or auxiliary plate 24. Accordingly, it becomes possible to keep the liquid (water) from flowing out.

In addition, in the second embodiment, because the exposure operation of the wafer on one of the wafer tables and the mark detection operation (and wafer exchange operation) of the wafer on the other wafer table are performed in parallel, throughput can be improved compared with when wafer exchange, mark detection operation, and exposure is performed sequentially. In the case the exposure apparatus is equipped with two or more wafer tables, exposure can be performed on one of the wafer tables, while on another wafer table, drying time may be arranged to completely dry the wafer. In such a case, in order to optimize the throughput, it is desirable to arrange three wafer tables and perform a parallel processing sequence of performing exposure operation on the first wafer table, performing alignment operation on the second wafer table, and performing wafer drying after exposure and wafer exchange operation on the third wafer table.

In the second embodiment, it is desirable to convert the positional information (array coordinates) of the plurality of shot areas on wafer W obtained by the mark detection operation (such as wafer alignment measurement by the EGA method) into information that uses the fiducial marks on fiducial mark plate FM as a reference. Then, when the wafer that has completed the alignment measurement moves onto stage 52, by measuring the relative position of the marks on the reticle and the fiducial marks on fiducial mark plate FM using the reticle alignment system (not shown), the relative position between the reticle and each shot area on wafer W can be adjusted with high precision to a desired relation, even in the case when the wafer table is being moved and the positional information is difficult to detect continuously.

In addition, as exposure apparatus that are equipped with a plurality of tables, the present invention can also be suitably applied to exposure apparatus disclosed in, for example, Kokai (Japanese Unexamined Patent Publication) Nos. 10-163099 and 10-214783 (corresponding U.S. Pat. Nos. 6,341,007, 6,400,441, 6,549,269, and 6,590,634), Kohyo (Japanese Unexamined Patent Publication) No. 2000-505958 (corresponding U.S. Pat. No. 5,969,441), and U.S. Pat. No. 6,208,407.

In addition, as an exposure apparatus equipped with a plurality of tables, the present invention can also be suitably applied to the exposure apparatus disclosed in, for example, Kokai (Japanese Unexamined Patent Publication) No. 11-135400 (corresponding International Publication No. WO99/23692).

As long as the national laws in designated states or elected states, to which this international application is applied, permit, the disclosures of each of the publications and the corresponding U.S. patents cited above are fully incorporated herein by reference.

Figure 11A:
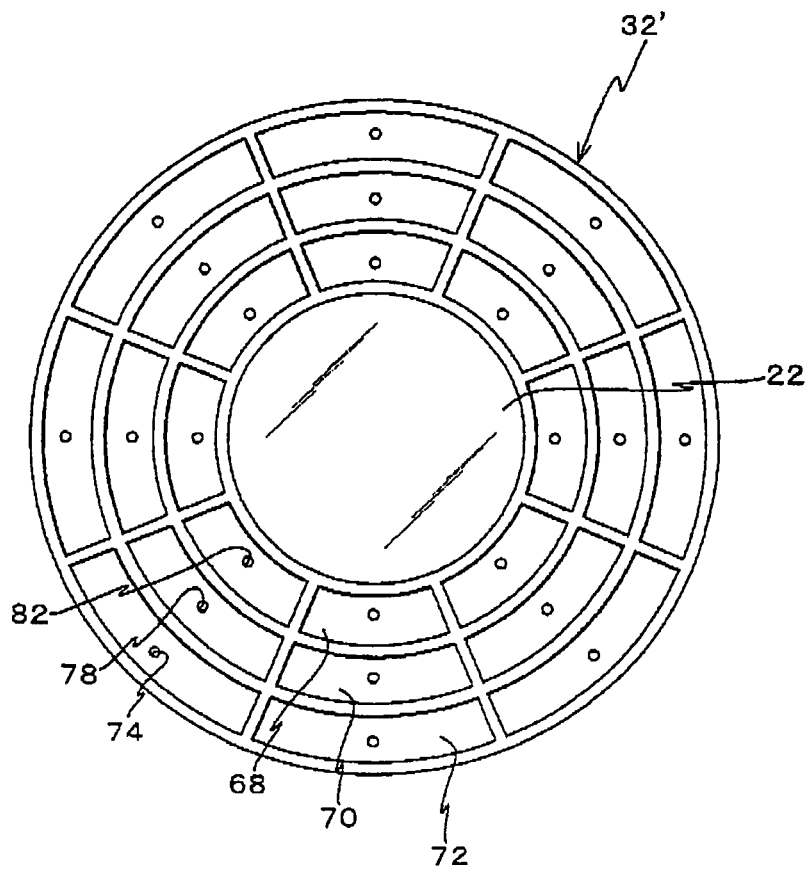
FIG. 11A is a view used to describe a modified example of a hydrostatic pad.

The configuration of hydrostatic pad 32 is not limited to the ones described in each of the embodiments above, and hydrostatic pad 32 may employ a configuration such as a hydrostatic pad 32' shown in FIG. 11A. More specifically, drainage groove 68, water supply groove 70, and drainage groove 72 may be divided with partition walls that are spaced apart at an equal angle (hereinafter, the section surrounded by the partition walls is to be referred to as a 'cell', and the cells formed in drainage grooves 68 and 72 are to be referred to as 'drainage cells' and the cells formed in water supply groove 70 are to be referred to as 'water supply cells').

On the bottom surface of the drainage cells, a through hole 74 that penetrate the page surface of FIG. 11A in a right angle direction (the Z-axis direction) is formed in each cell, whereas on the bottom surface of the water supply cells formed in water supply groove 70, a through hole 78 is formed in each cell, and on the bottom surface of the drainage cells formed in drainage groove 68, a through hole 82 is formed in each cell.

By forming the cells dividing the water supply groove and the drainage grooves with partition walls, in the case when the pressure of the cells corresponding to the edge of the wafer changes when hydrostatic pad 32 comes into contact with the edge of the wafer, the influence of such pressure change can be kept from affecting other cells.

Figure 11B:
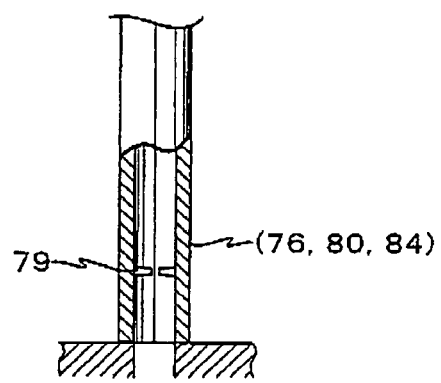
FIG. 11B is a view that shows a water supply piping (and a water drainage piping) that can be suitably used in the hydrostatic pad in FIG. 11A.

In water supply pipes 80 and drainage pipes 84 and 76, connecting to through holes 78, 82, and 74, respectively, a stop 79 may be arranged as is shown in FIG. 11B. Also in this case, when a part of the cells come into contact with the edge of the wafer, stop 79 can keep the influence of such pressure change from affecting other cells as much as possible.

In addition, hydrostatic pad 34 on the lower side can employ the configuration shown in FIG. 11A, and a stop as in FIG. 11B can be arranged in the water supply pipes and the drainage pipes connecting to hydrostatic pad 34.

In each of the embodiments above, solid immersion lens SIL is employed as the optical element of projection optical system PL closest to the image plane (wafer W). However, instead of solid immersion lens SIL, a lens element composed of quartz or fluorite can be used, or a non-refractive power parallel plane plate can also be used.

In addition, in each of the embodiments above, elastic body 25 is incorporated between auxiliary plate 24 and wafer table TB (TB1, TB2), however, if the gap between hydrostatic pad 32 and its opposing surface (the surface of wafer W, the upper surface of auxiliary plate 24) can be constantly maintained, elastic body 25 can be omitted.

In each of the embodiments above, ultra pure water (water) is used as the liquid; however, it is a matter of course that the present invention is not limited to this. As the liquid, a safe liquid that is chemically stable and has high transmittance to illumination light IL, such as a fluorine-based inert liquid, can be used. As such fluorine-based inert liquid, for example, Florinert (trade name; manufactured by 3M) can be used. The fluorine-based inert liquid is also excellent from the point of cooling effect. In addition, as the liquid, a liquid which has high transmittance to illumination light IL and a refractive index as high as possible, and furthermore, a liquid which is stable against the projection optical system and the photoresist coated on the surface of the wafer (for example, cederwood oil or the like) can also be used.

In addition, in each of the embodiments above, the case has been described where the path supplying the liquid to the hydrostatic pad (or under SIL 22) and the path recovering the liquid from the hydrostatic pad are different. However, a configuration that employs the combination of a circulation path that supplies the liquid recovered from the hydrostatic pad (or under SIL 22) again to the hydrostatic pad (or under SIL 22) and the liquid supply/drainage unit can be employed. In this case, in the circulation path, it is desirable to arrange a filter for removing impurities from the liquid that is collected, in a part of the recovery path.

In each of the embodiments described above, an auxiliary plate is provided in the periphery of the area where wafer W is mounted on the wafer table; however, in the present invention, there are some cases where the exposure apparatus does not necessarily require an auxiliary plate or a flat plate that has a similar function on table. In this case, however, it is preferable to further provide piping on the wafer table for recovering the liquid so that the supplied liquid is not spilled from the wafer table.

In each of the embodiments described above, in the case when the surface of the wafer is locally uneven, the surface of the wafer (exposure surface) and the image plane may be misaligned. Accordingly, in the case when the surface of the wafer is expected to be uneven, information on the unevenness of the wafer can be stored prior to exposure, and during exposure, the position and the shape of the image plane can be adjusted by performing at least one of moving a part of the lens of the projection optical system, moving the reticle, and finely adjusting the wavelength of the exposure light.

In each of the embodiments above, as illumination light IL, far ultraviolet light such as the ArF excimer laser beam or the KrF excimer laser beam, or bright lines in the ultraviolet region generated by an ultra high-pressure mercury lamp (such as the g-line or the i-line) is used. The present invention, however, is not limited to this, and a harmonic wave (e.g., with a wavelength of 193 nm) may also be used that is obtained by amplifying a single-wavelength laser beam in the infrared or visible range emitted by a DFB semiconductor laser or fiber laser, with a fiber amplifier doped with, for example, erbium (Er) (or both erbium and ytteribium (Yb)), and by converting the wavelength into ultraviolet light using a nonlinear optical crystal.

In addition, projection optical system PL is not limited to a dioptric system, and a catadioptric system may also be used. Furthermore, the projection magnification is not limited to magnification such as ¼ or ⅕, and the magnification may also be ¹⁄₁₀ or the like.

In each of the embodiments described above, the case has been described where the present invention is applied to a scanning exposure apparatus based on the step-and-scan method. It is a matter of course, however, that the present invention is not limited to this. More specifically, the present invention can also be suitably applied to a reduction projection exposure apparatus based on a step-and-repeat method. In this case, besides the point that exposure is performed by a scanning exposure method, the exposure apparatus can basically employ the structure similar to the one described in the first embodiment and obtain the same effect.

The exposure apparatus in each of the embodiments described above can be made by incorporating the illumination optical system made up of a plurality of lenses, projection unit PU, and hydrostatic pads 32, 34, and the like into the main body of the exposure apparatus, and by attaching the piping to hydrostatic pads 32, 34, and the like. Then, along with the optical adjustment operation, parts such as the reticle stage and the wafer stage made up of multiple mechanical parts are also attached to the main body of the exposure apparatus and the wiring and piping connected. And then, total adjustment (such as electrical adjustment and operation check) is performed, which completes the making of the exposure apparatus. The exposure apparatus is preferably built in a clean room where conditions such as the temperature and the degree of cleanliness are controlled.

In addition, in each of the embodiments described above, the case has been described where the present invention is applied to exposure apparatus used for manufacturing semiconductor devices. The present invention, however, is not limited to this, and it can be widely applied to an exposure apparatus for manufacturing liquid crystal displays which transfers a liquid crystal display device pattern onto a square shaped glass plate, and to an exposure apparatus for manufacturing thin-film magnetic heads, imaging devices, micromachines, organic EL, DNA chips, or the like.

In addition, the present invention can also be suitably applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, or an electron beam exposure apparatus. Normally, in the exposure apparatus that uses DUV (deep (far) ultraviolet) light or VW (vacuum ultraviolet) light, it uses a transmittance type reticle, and as the reticle substrate, materials such as silica glass, fluorine-doped silica glass, fluorite, magnesium fluoride, or crystal are used.

Device Manufacturing Method An embodiment is described below of a device manufacturing method in the case where the exposure apparatus described above is used in a lithographic process.

Figure 12:
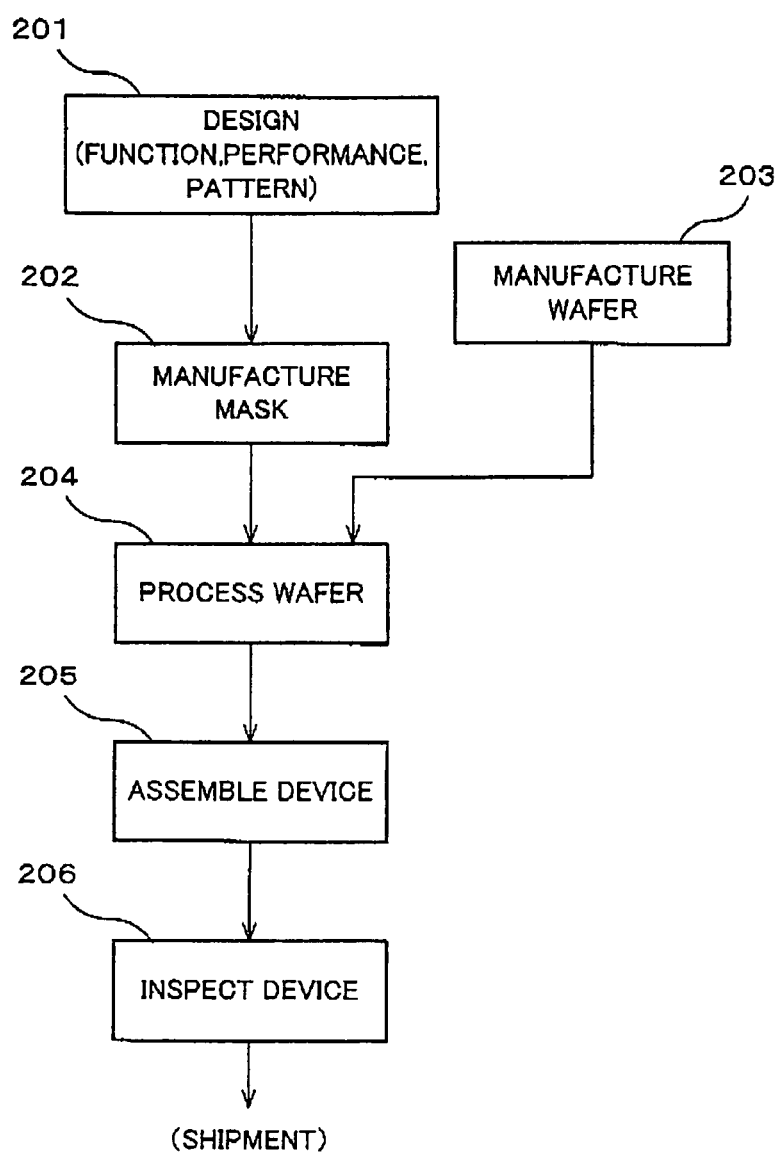
FIG. 12 is a flow chart used to explain an embodiment of a device manufacturing method according to the present invention.

FIG. 12 shows a flow chart of an example when manufacturing a device (like an IC or an LSI as in a semiconductor chip, a liquid crystal panel, a CCD, a thin magnetic head, a micromachine, or the like). As is shown in FIG. 12, in step 201 (design step), the function/performance design of a device (for example, designing a circuit for a semiconductor device) is performed, and pattern design to implement such function is performed. Then, in step 202 (mask manufacturing step), a mask on which the designed circuit pattern is formed is manufactured, whereas, in step 203 (wafer manufacturing step), a wafer is manufactured using materials such as silicon.

Next, in step 204 (wafer processing step), the actual circuit or the like is formed on the wafer by lithography or the like in a manner which will be described later on, using the mask and wafer prepared in steps 201 to 203. Then, in step 205 (device assembly step), device assembly is performed using the wafer processed in step 204. Step 205 includes processes such as the dicing process, the bonding process, and the packaging process (chip encapsulation) when necessary.

Finally, in step 206 (inspection step), tests on operation, durability, and the like are performed on the devices made in step 205. After these steps, the devices are completed and shipped out.

Figure 13:
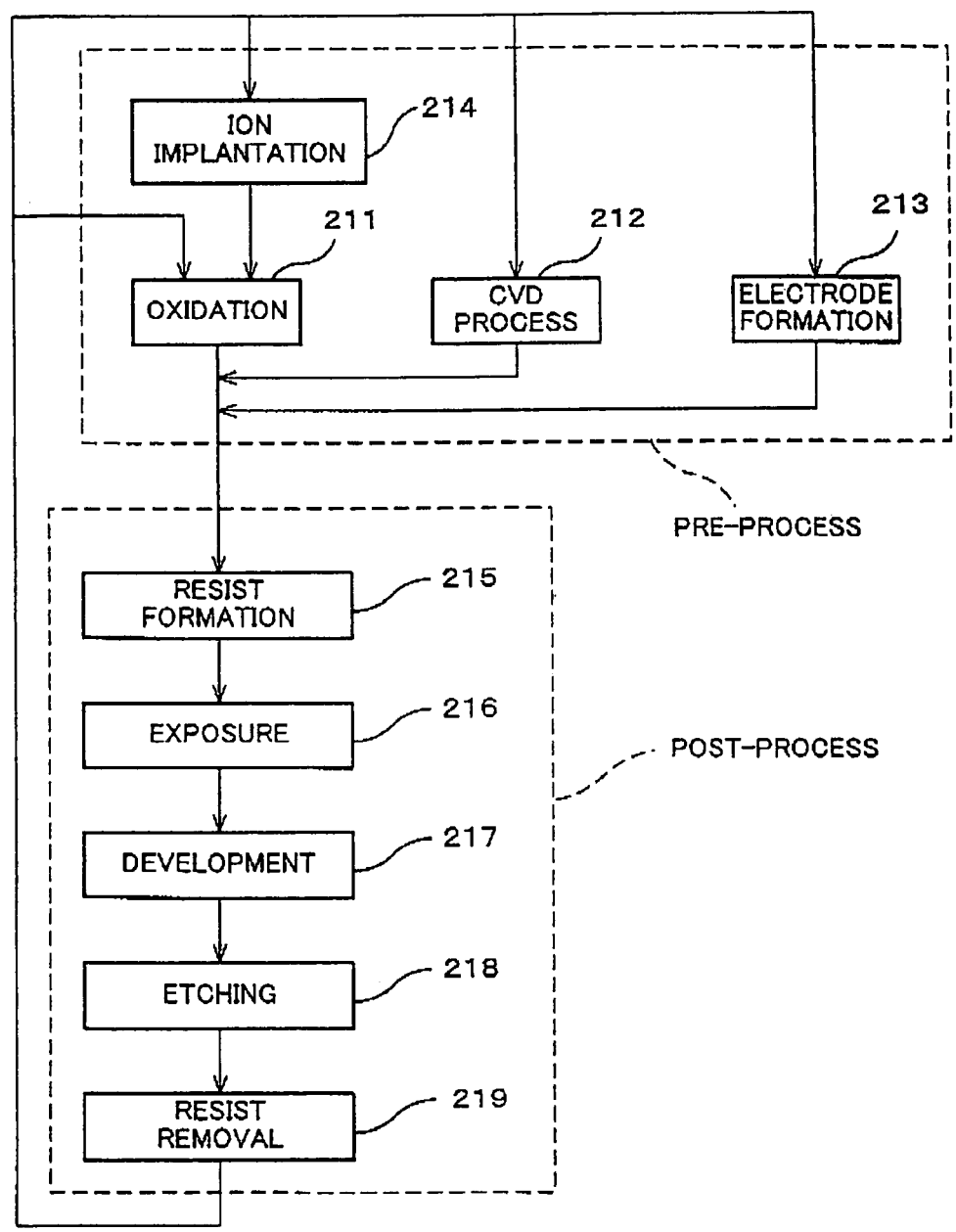
FIG. 13 is a flow chart that shows a concrete example related to step 204 in FIG. 12.

FIG. 13 is a flow chart showing a detailed example of step 204 described above when manufacturing a semiconductor device. Referring to FIG. 13, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above make up a pre-process in each stage of wafer processing, and the necessary processing is chosen and is executed at each stage.

When the above pre-process is completed in each stage of wafer processing, a post-process is executed in the manner described below. In this post-process, first, in step 215 (resist formation step), the wafer is coated with a photosensitive agent. Next, in step 216 (exposure step), the circuit pattern on the mask is transferred onto the wafer by the exposure apparatus and the exposure method described above. And, in step 217 (development step), the wafer that has been exposed is developed. Then, in step 218 (etching step), an exposed member of an area other than the area where the resist remains is removed by etching. Finally, in step 219 (resist removing step), when etching is completed, the resist that is no longer necessary is removed.

By repeatedly performing such pre-process and post-process, multiple circuit patterns are formed on the wafer.

When the device manufacturing method of the embodiment described so far is used, because the exposure apparatus described in each of the embodiments above is used in the exposure process (step 216), the pattern of the reticle can be transferred on the wafer with good accuracy. As a consequence, the productivity (including the yield) of highly integrated microdevices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes a substrate with an energy beam via a projection optical system and a liquid, the apparatus comprising:
    a table member configured to move while the substrate is mounted thereon;
    a liquid retaining member configured to move relative to the table member; and
    a liquid immersion system that supplies the liquid to and locally forms a liquid immersion region below the projection optical system, wherein
    the liquid retaining member and the table member are replaceable by each other at a position opposite the projection optical system while the liquid immersion region is maintained in contact with a lower surface of the projection optical system so as to transition from a first state to a second state, the first state in which the liquid immersion region is maintained between the projection optical system and the liquid retaining member, the second state in which the liquid immersion region is maintained between the projection optical system and the table member,
    an exposure operation for the substrate is performed in succession to the transition,
    during the exposure operation, the substrate is moved relative to the liquid immersion region by the table member, and
    the liquid immersion system includes a liquid immersion member that encircles the lower surface of the projection optical system and has (i) a lower surface that faces the substrate during the exposure operation, (ii) an opening in the lower surface through which the energy beam passes, and (iii) at least one recovery opening in the lower surface through which the liquid is recovered from the immersion region.

2. The exposure apparatus according to claim 1, further comprising a measurement system that performs a measurement operation with a measurement member of the table member,
    wherein the measurement operation is performed after the table member is located opposite the projection optical system by the transition and prior to start of the exposure operation for the substrate.

3. The exposure apparatus according to claim 2, wherein the measurement member has a surface that is substantially flush with a surface of the table member.

4. The exposure apparatus according to claim 1, further comprising a measurement apparatus that has an encoder that obtains positional information of the table member,
    and wherein, during the exposure operation, the table member is moved while the positional information thereof is obtained by the encoder.

5. The exposure apparatus according to claim 4, wherein the encoder obtains the positional information by use of a scale that is provided on a back surface of the table member.

6. The exposure apparatus according to claim 1, wherein, for the transition, the table member and the liquid retaining member are moved together in a direction orthogonal to an axis of the projection optical system.

7. The exposure apparatus according to claim 6, wherein the table member and the liquid retaining member are moved in a close state with each other and moved below the projection optical system.

8. The exposure apparatus according to claim 6, wherein the table member and the liquid retaining member are moved in a close state so as to maintain the liquid immersion region below the projection optical system and to prevent the liquid from spilling.

9. The exposure apparatus according to claim 6, wherein, in the transition, the table member and the liquid retaining member are in a close state facing each other in a predetermined direction and are moved in the predetermined direction.

10. The exposure apparatus according to claim 9, wherein the table member and the liquid retaining member are simultaneously moved while a positional relation thereof in the predetermined direction is maintained.

11. The exposure apparatus according to claim 9, wherein the table member and the liquid retaining member are moved to approach each other in the predetermined direction so that the table member and the liquid retaining member are in a close state.

12. The exposure apparatus according to claim 11,
wherein, for the table member and the liquid retaining member, movement to approach each other in the predetermined direction and adjustment of a positional relation in a direction orthogonal to the predetermined direction are performed.

13. The exposure apparatus according to claim 6,
wherein the table member and the liquid retaining member are moved while in contact with each other and while below the projection optical system.

14. The exposure apparatus according to claim 6,
wherein, during the transition, the liquid immersion region is maintained below the projection optical system with at least one of the table member and the liquid retaining member.

15. The exposure apparatus according to claim 6,
wherein, in an intermediate state between the first and second states, the liquid immersion region is maintained below the projection optical system with both the table member and the liquid retaining member.

16. The exposure apparatus according to claim 1,
wherein the table member has a mount area on which to mount the substrate and a peripheral area around the mount area, the peripheral area having a surface that is substantially flush with a surface of the substrate mounted on the mount area.

17. The exposure apparatus according to claim 16,
wherein, in the first state and in the second state, the liquid immersion region is maintained between the projection optical system and the surface of the peripheral area.

18. The exposure apparatus according to claim 1,
wherein the table member is moved from one to the other of first and second areas, the first area in which the projection optical system is located, the second area being different from the first area, and wherein a course over which the table member passes when moving from the first area to the second area is different from a course over which the table member passes when moving from the second area to the first area.

19. The exposure apparatus according to claim 18,
wherein, for the table member, the exposure of the substrate is performed in the first area, then the transition is performed, and then the substrate after the exposure operation is exchanged in the second area.

20. The exposure apparatus according to claim 18,
further comprising a mark detecting system that is placed in the second area and detects a mark on the substrate in a measurement operation,
and wherein, after the measurement operation of the mark by the mark detecting system, the table member is moved from the second area to the first area.

21. The exposure apparatus according to claim 20,
wherein the substrate mounted on the table member is exposed via the liquid, and the mark detecting system detects the mark via no liquid.

22. The exposure apparatus according to claim 1,
further comprising a second table member different from the table member, the second table member configured to mount a second substrate.

23. The exposure apparatus according to claim 1,
wherein the liquid immersion member is provided around an optical member of the projection optical system, the optical member being in contact with the liquid, the liquid immersion member having a supply path and a recovery path for the liquid.

24. A device manufacturing method including a lithography process, wherein in the lithography process, a device pattern is transferred onto a substrate using the exposure apparatus according to claim 1.

25. An exposure method of exposing a substrate with an energy beam via a projection optical system, the method comprising:
locally forming a liquid immersion region by supplying a liquid to a space below the projection optical system so that the liquid immersion region is maintained between the projection optical system and a liquid retaining member, the liquid retaining member being capable of moving relative to a table member on which the substrate is mounted;
replacing the liquid retaining member with the table member at a position opposite the projection optical system while the liquid immersion region is maintained in contact with a lower surface of the projection optical system so as to transition from a first state to a second state, the first state in which the liquid immersion is maintained between the projection optical system and the liquid retaining member, the second state in which the liquid immersion region is maintained between the projection optical system and the table member; and
exposing the substrate mounted on the table member via the projection optical system and the liquid during an exposure operation, wherein
during the exposure operation, the substrate is moved relative to the liquid immersion region by the table member, and
the liquid is supplied by a liquid immersion member that encircles the lower surface of the projection optical system and has (i) a lower surface that faces the substrate during the exposure operation, (ii) an opening in the lower surface through which the energy beam passes, and (iii) at least one recovery opening in the lower surface through which the liquid is recovered from the immersion region.

26. The exposure method according to claim 25,
wherein a measurement operation with a measurement member of the table member is performed after the table member is located opposite the projection optical system by the transition and prior to start of the exposure operation for the substrate.

27. The exposure method according to claim 26,
wherein the measurement member has a surface that is substantially flush with a surface of the table member.

28. The exposure method according to claim 25,
wherein, during the exposure operation, the table member is moved while positional information thereof is obtained by an encoder.

29. The exposure method according to claim 28,
wherein the encoder obtains the positional information by use of a scale that is provided on a back surface of the table member.

30. The exposure method according to claim 25,
wherein, for the transition, the table member and the liquid retaining member are moved together in a direction orthogonal to an axis of the projection optical system.

31. The exposure method according to claim 30,
wherein the table member and the liquid retaining member are moved in a close state with each other and moved below the projection optical system.

32. The exposure method according to claim 30,
wherein the table member and the liquid retaining member are moved in a close state so as to maintain the liquid immersion region below the projection optical system and to prevent the liquid from spilling.

33. The exposure method according to claim 30,
wherein, in the transition, the table member and the liquid retaining member are in a close state facing each other in a predetermined direction and are moved in the predetermined direction.

34. The exposure method according to claim 33,
wherein the table member and the liquid retaining member are simultaneously moved while a positional relation thereof in the predetermined direction is maintained.

35. The exposure method according to claim 33,
wherein the table member and the liquid retaining member are moved to approach each other in the predetermined direction so that the table member and the liquid retaining member are in a close state.

36. The exposure method according to claim 35,
wherein, for the table member and the liquid retaining member, movement to approach each other in the predetermined direction and adjustment of a positional relation in a direction orthogonal to the predetermined direction are performed.

37. The exposure method according to claim 30,
wherein the table member and the liquid retaining member are moved while in contact with each other and while below the projection optical system.

38. The exposure method according to claim 30,
wherein, during the transition, the liquid immersion region is maintained below the projection optical system with at least one of the table member and the liquid retaining member.

39. The exposure method according to claim 30,
wherein, in an intermediate state between the first and second states, the liquid immersion region is maintained below the projection optical system with both the table member and the liquid retaining member.

40. The exposure method according to claim 35,
wherein the table member has a mount area on which to mount the substrate and a peripheral area around the mount area, the peripheral area having a surface that is substantially flush with a surface of the substrate mounted on the mount area.

41. The exposure method according to claim 40,
wherein, in the first state and in the second state, the liquid immersion region is maintained between the projection optical system and the surface of the peripheral area.

42. The exposure method according to claim 25,
wherein the table member is moved from one to the other of first and second areas, the first area in which the projection optical system is located, the second area being different from the first area.

43. The exposure method according to claim 42,
wherein, for the table member, the exposure of the substrate is performed in the first area, then the transition is performed, and then the substrate after the exposure operation is exchanged in the second area.

44. The exposure method according to claim 42, wherein a mark detecting system that is located in the second area detects a mark on the substrate in a measurement operation, and
after the measurement operation of the mark by the mark detecting system, the table member is moved from the second area to the first area.

45. The exposure method according to claim 44,
wherein the substrate mounted on the table member is exposed via the liquid, and the mark detecting system detects the mark via no liquid.

46. The exposure method according to claim 25,
further comprising performing a second operation different from the exposure operation by using a second table member that is different from the table member and on which the substrate is mounted.

47. The exposure method according to claim 25,
wherein the liquid immersion member is provided around an optical member of the projection optical system, the optical member being in contact with the liquid, the liquid immersion member having a supply path and a recovery path for the liquid therein.

48. A device manufacturing method including a lithography process, wherein
in the lithography process, a device pattern is transferred onto a substrate using the exposure method according to claim 25.

* * * * *